United States Patent [19]

Carrubba et al.

[11] 4,091,242

[45] May 23, 1978

[54] HIGH SPEED VOICE REPLAY VIA DIGITAL DELTA MODULATION

[75] Inventors: Francis Paul Carrubba, North Haven, Conn.; Walter Edgar Daniels, Jr., Mohegan Lake; Peter Anthony Franaszek, Ossining, both of N.Y.

[73] Assignee: International Business Machines Corporation, Armonk, N.Y.

[21] Appl. No.: 814,591

[22] Filed: Jul. 11, 1977

[51] Int. Cl.² ............................................. G11B 13/00
[52] U.S. Cl. ............................ 179/15.55 T; 325/38 B
[58] Field of Search .......... 179/1 SA, 1 SM, 15.55 T; 325/38 B; 332/11 D; 360/8; 358/133, 141, 146, 260, 261

[56] References Cited

U.S. PATENT DOCUMENTS

| | | | |
|---|---|---|---|
| 3,104,284 | 9/1963 | French et al. | 179/15.55 R |
| 3,949,175 | 4/1976 | Tanizoe et al. | 179/15.55 T |
| 3,971,987 | 7/1976 | Carrubba et al. | 325/38 B |

Primary Examiner—Thomas W. Brown
Assistant Examiner—E. S. Kemeny
Attorney, Agent, or Firm—Jack M. Arnold

[57] ABSTRACT

A method of and apparatus for time compression and changing the readout speed of a delta modulation encoded audio signal. The encoded audio signal has portions selectively deleted therefrom in accordance with detected zero crossovers of the same sign which occur in a predetermined timing sequence. The encoded audio signal which has had portions selectively deleted therefrom is decoded, with the undeleted decoded portions being joined. The undeleted portions have the same gain factor where joined, thereby eliminating step transients.

5 Claims, 20 Drawing Figures

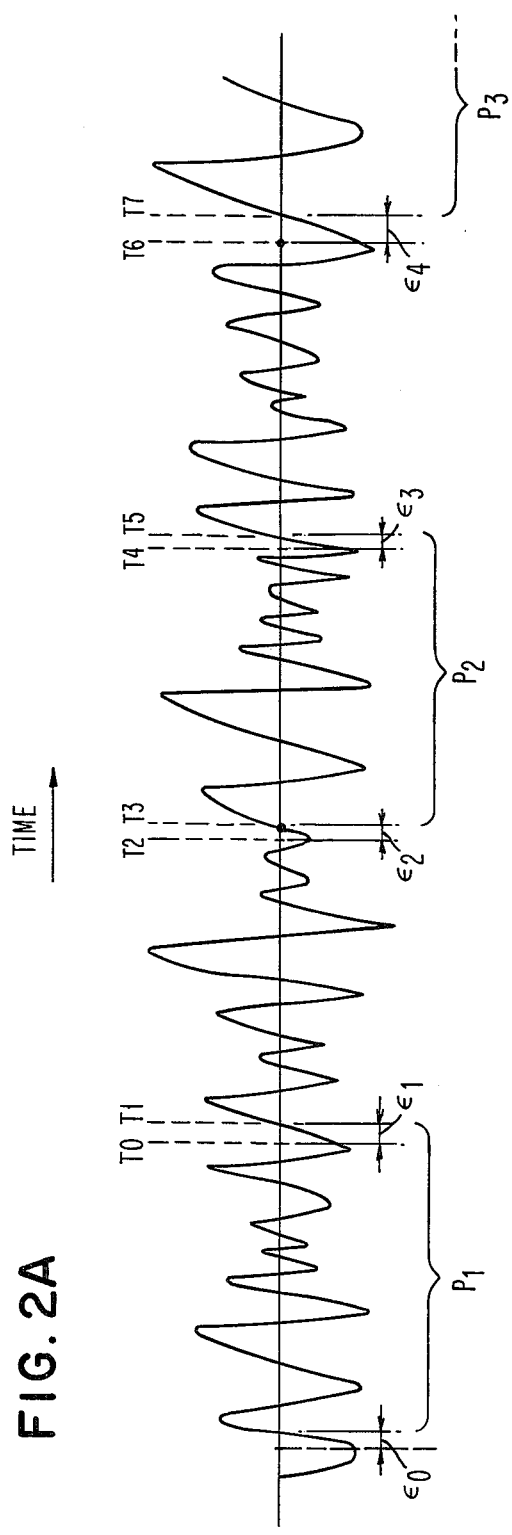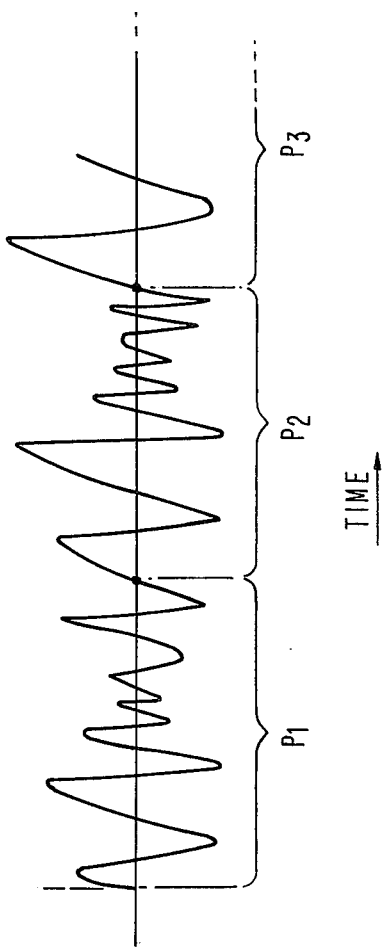
FIG. 2A
FIG. 2B

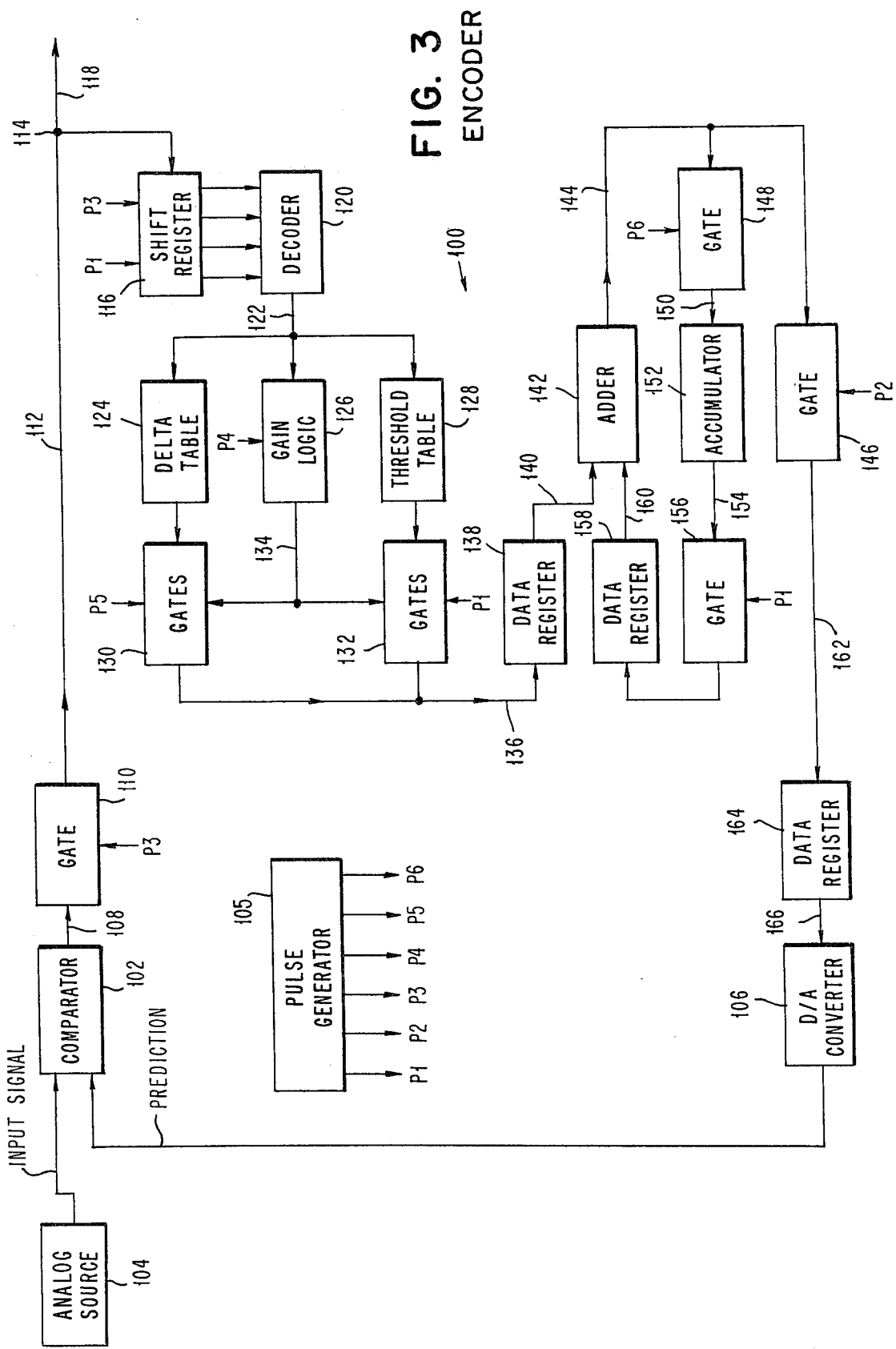

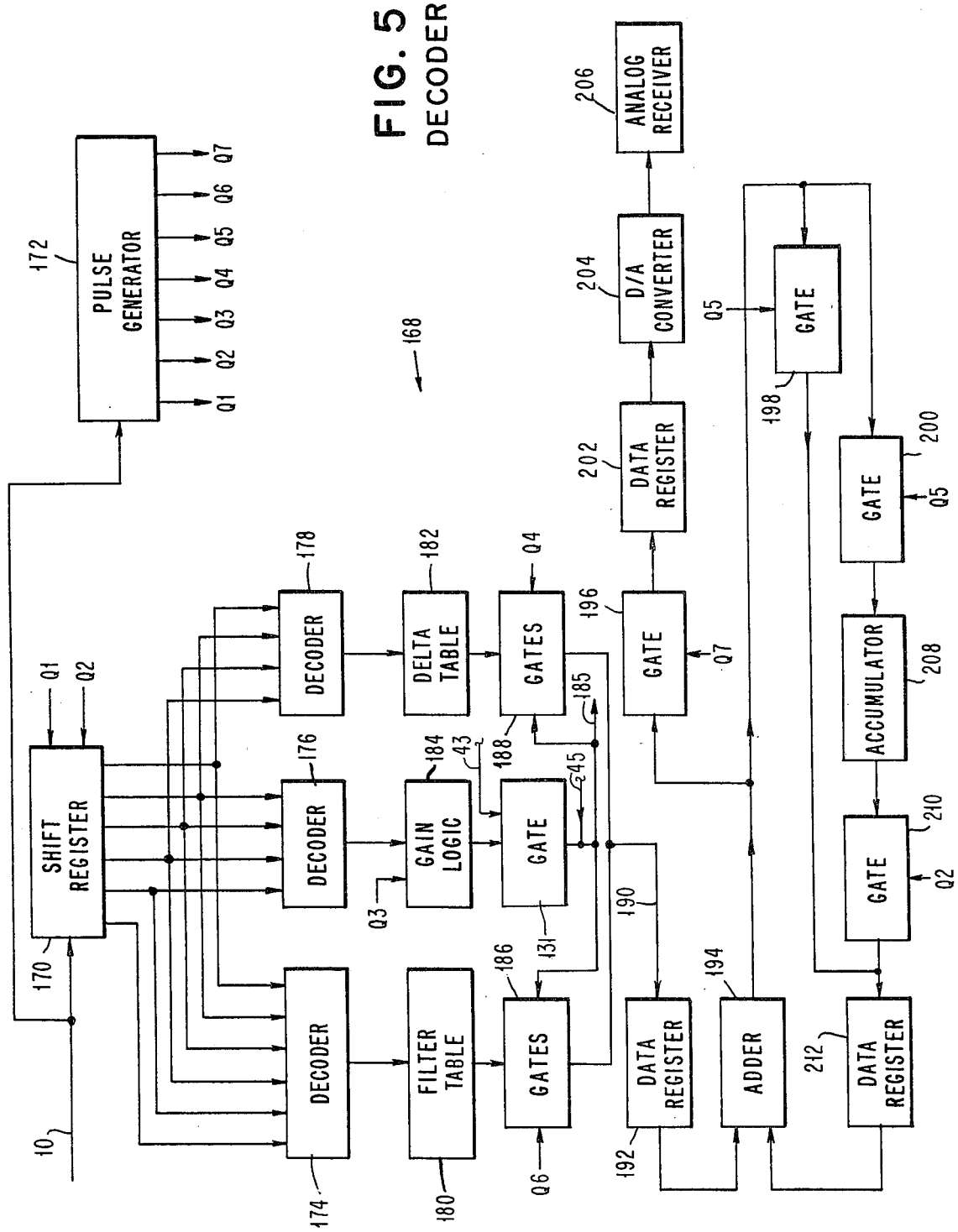
FIG. 5 DECODER

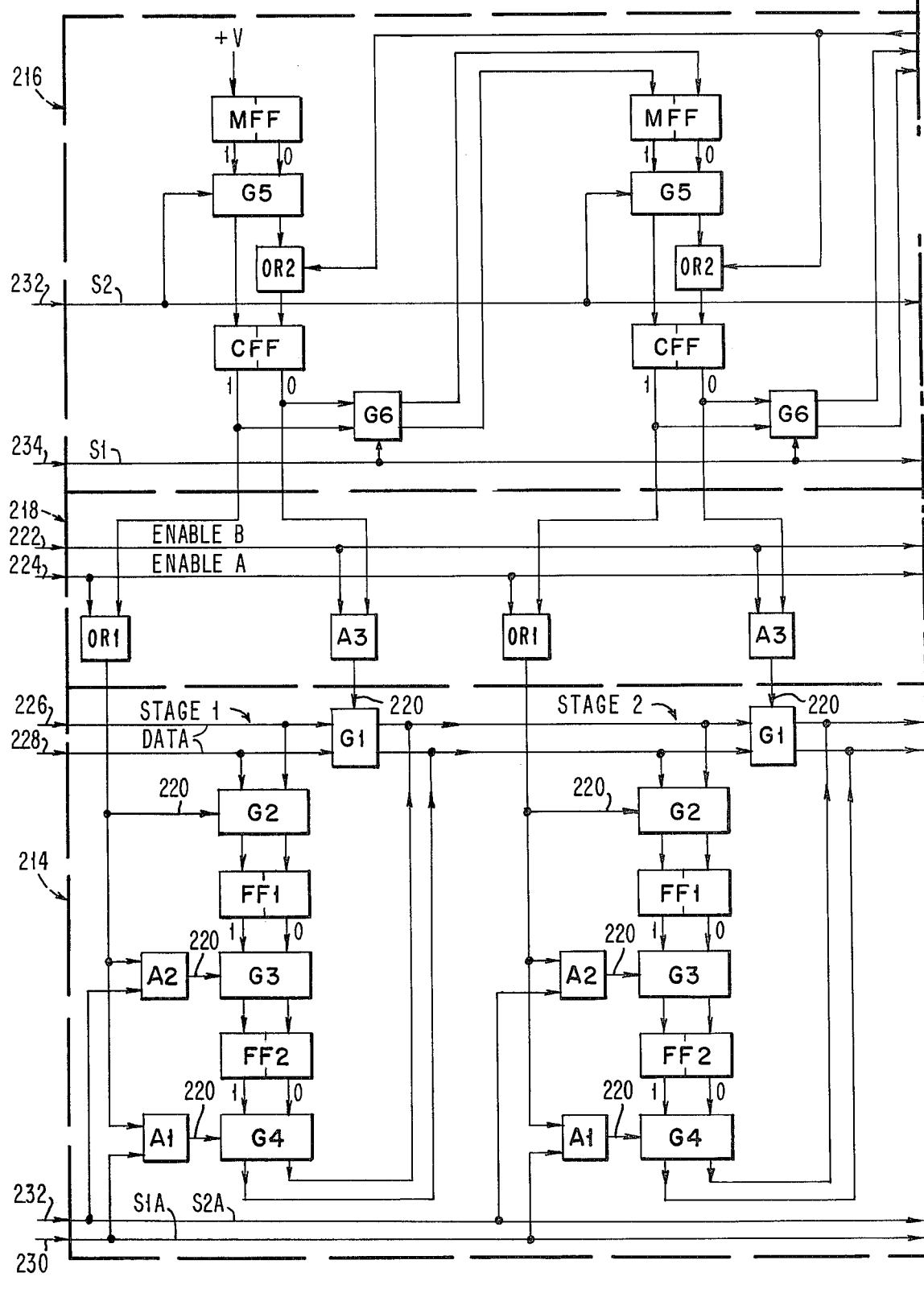

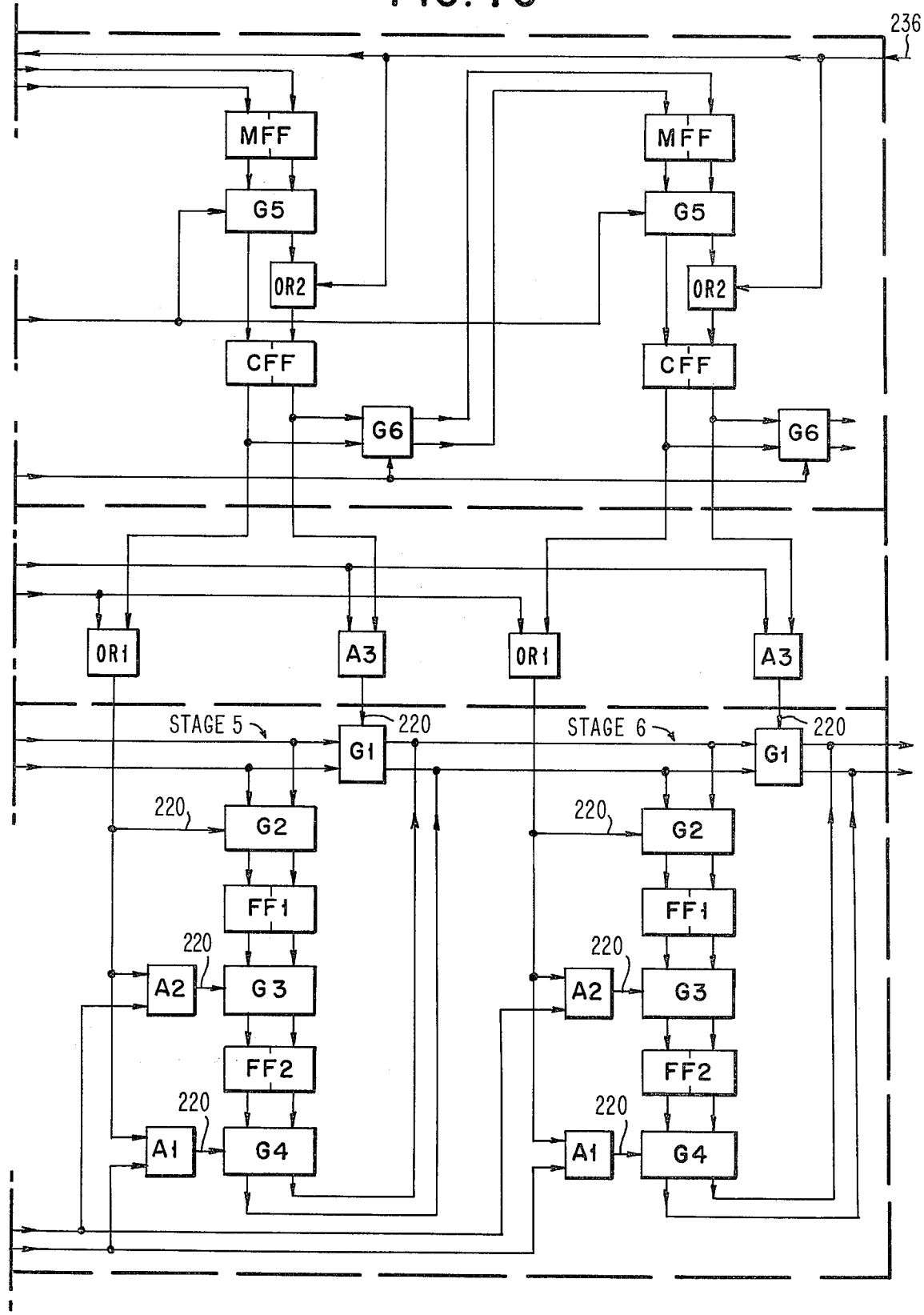

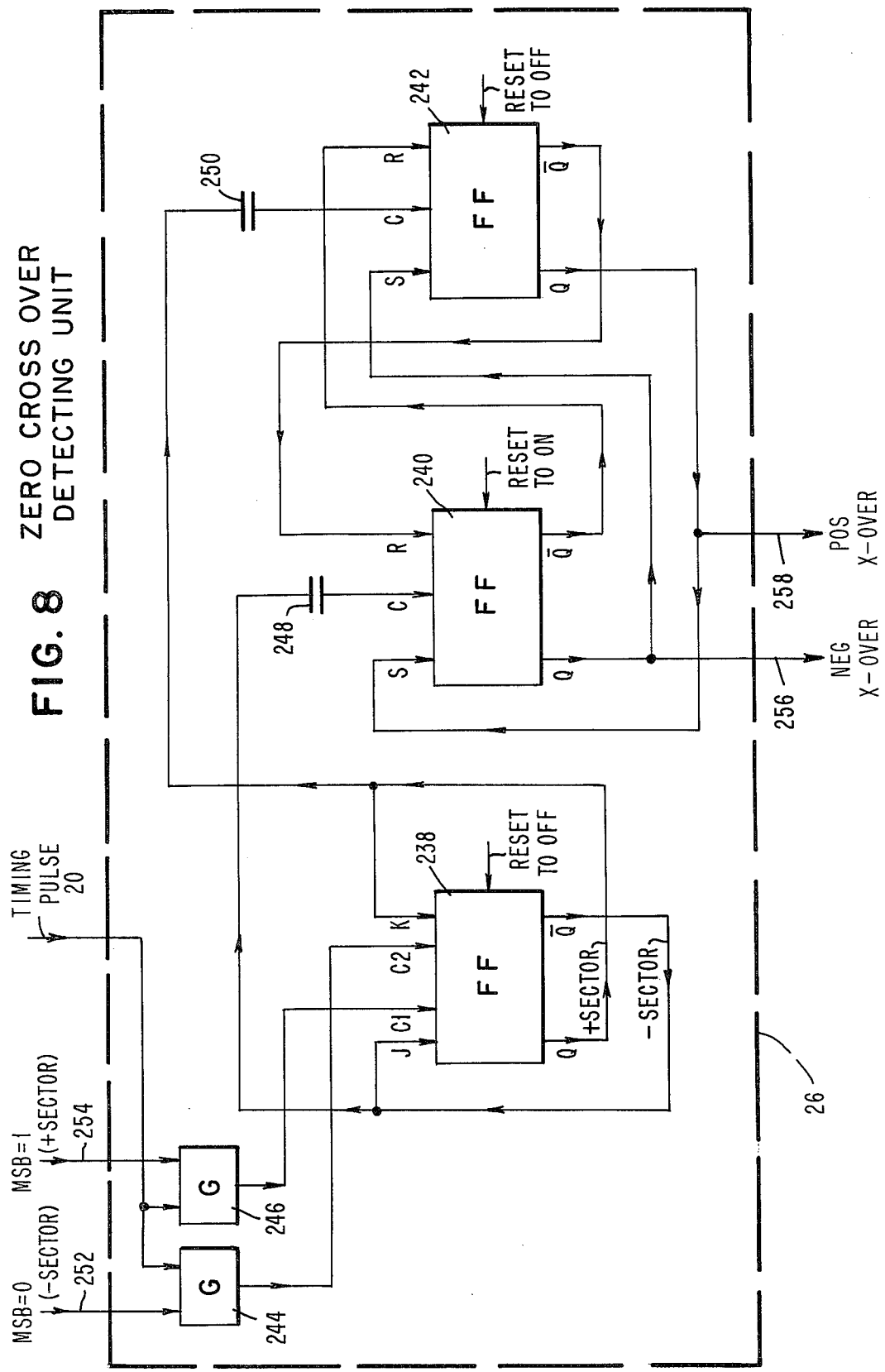

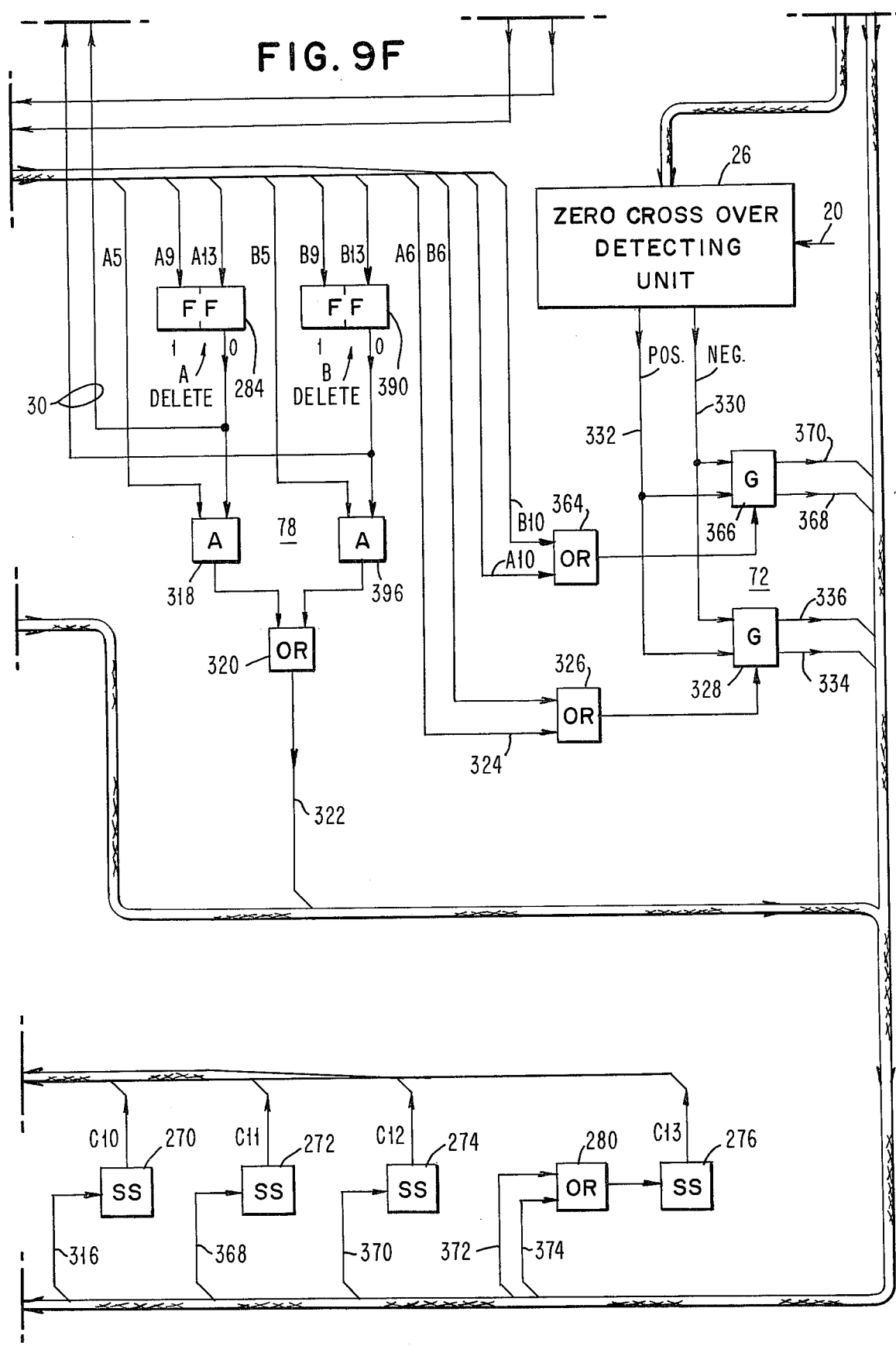

HIGH SPEED VOICE REPLAY VIA DIGITAL DELTA MODULATION

BACKGROUND OF THE INVENTION

The present invention relates to the modification of the time duration of an audible waveform and more particularly to the compression of a voiced audio waveform to fit within predetermined time boundaries, while preserving the intelligibility and quality of the information contained in the waveform.

In the prior art there are two general methods of speeding up (time compressing) a recorded sample of speech: (1) by increasing the speed of playback which raises all the frequencies by an amount equal to the ratio of the speed-up, and (2) by sampling in short segments and reassembling only a portion of the segments. In the second method, a chopping technique may be used to remove some of the short sample segments. If the gaps in the recorded speech are removed, an increase in the speech rate with no great loss in intelligibility, for small chops, may result. This latter method does not have the disadvantage of shifting the frequency of the speech spectrum with acceleration.

Such a chopping technique has been used to either expand or compress an audio waveform by indiscriminately chopping out or duplicating portions of the waveform to expand or compress the audio waveform to a desired length. The sound produced from a waveform which has had indiscriminately selected portions chopped out or duplicated is generally of poor quality. This is so, due to the step transients which result from the utilized implementation, for example pulse code modulation (PCM) techniques which result in a clicking sound where the chopped portions of the speech segments are joined together.

In the prior art, there are a number of speech compression patents, both analog and digital which present alternative methods for achieving time compression of an audio signal. U.S. Pat. No. 3,504,352 to Stromswold, et al discloses a time compression system in which an analog input signal is stored in an analog memory rather than a digital memory, with the only digital aspect of the invention being directed to the timing sequence for reading information from the analog memory. U.S. Pat. No. 3,803,363 to Lee, discloses a time expansion or compression system for audio data in which the audio information is converted to digital form using standard A/D technology. Segments of the speech are removed by reading the signals into a memory at one rate and out at another rate. U.S. Pat. No. 3,104,284 to French et al, discloses a system for modifying the time duration of an audible waveform by expanding or compressing the audio waveform to fit within a predetermined time boundary. A standard A/D conversion technique is utilized for subtracting certain segments of the speech from the speech communication system wherein a speech signal is converted to binary signal form. Redundant portions of the binary signal are extracted and converted to delta modulated form. The binary signal, absent the redundant portion, and the delta modulated redundant signal are transmitted to a remote location, decoded and recombined to form an analog speech signal. There is, however, no teaching of a voice high speed replay system utilizing delta modulation techniques.

According to the present invention, an audio compression system is disclosed utilizing delta modulation techniques. An audio signal is delta modulation encoded and stored, with the encoded signal being checked for positive and negative zero crossovers to determine which portions of a speech segment should be deleted. The gain factor for each segment of the undeleted speech signals are matched such that step transients and the attendant clicking sounds are eliminated.

BRIEF DESCRIPTION OF THE DRAWINGS

FIG. 2A is a waveshape of an audio signal;

FIG. 2B is a waveshape of the audio signal of FIG. 2A with certain sections deleted;

FIG. 3 is a block diagram representation of a delta modulator encoder which may be used as the encoder set forth in FIG. 1;

FIG. 5 is a block diagram representation of a delta modulator decoder which may be used as the delta modulator decoders set forth in FIGS. 1 and 9;

FIGS. 7A, 7B and 7C taken together as shown in FIG. 7 is a block diagram representation of a shift register which may be used as the registers A and B set forth in FIGS. 1 and 9;

FIG. 8 is a block diagram representation of the zero crossover detector shown generally in FIGS. 1 and 9;

FIGS. 9A, 9B, 9C, 9D, 9E and 9F taken together as shown in FIG. 9, is a detailed block diagram representation of the high speed voice replay system set forth in FIG. 1.

SUMMARY OF THE INVENTION

According to the present invention, a delta modulator audio replay system and method of operating is disclosed in which a provided audio signal is delta modulation encoded and stored. There is means for determining the positive and negative zero crossovers of the delta modulation encoded audio signal, with means included for selectively deleting portions of the stored delta modulation encoded audio signal which occur between zero crossovers having the same sign. Further, there is means for delta modulation decoding of the stored delta modulation encoded signal which has had portions selectively deleted therefrom, including means for joining the undeleted decoded portions, with the undeleted portions having the same gain factor where joined.

DESCRIPTION OF PREFERRED EMBODIMENT

Figure 1:
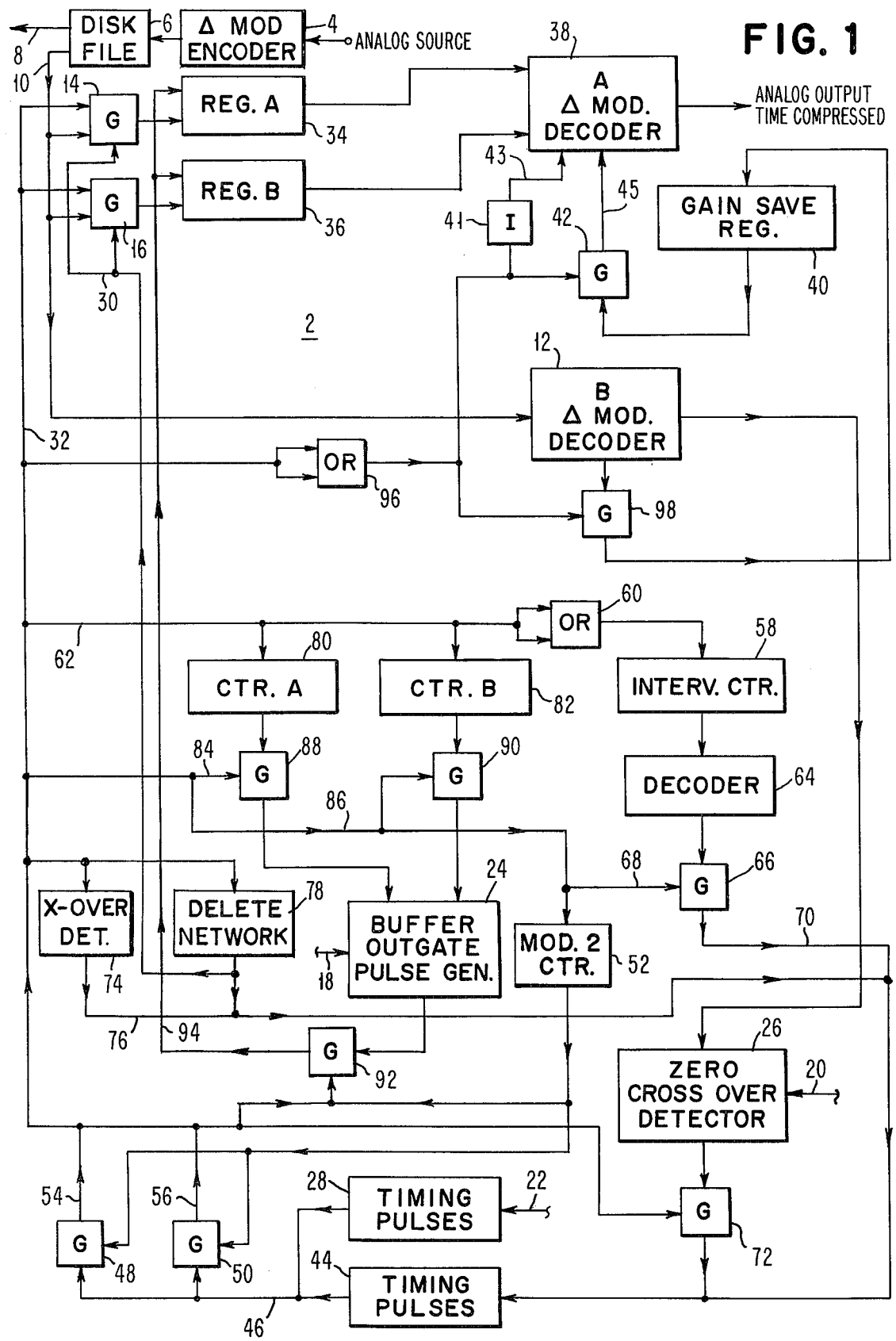
FIG. 1 is a block diagram representation of a high speed voice replay system according to the present invention.

In FIG. 1, a high-speed voice replay system is illustrated generally at 2. A delta modulator encoder 4 provides an encoded voice signal to a disk file 6 which provides a timing signal output on line 8 and a data signal on line 10. The data signal on line 10 is provided to the input of a delta modulator decoder 12 and to first inputs of gates 14 and 16. The timing signals on line 8 are provided to inputs 18, 20 and 22 of buffer output gate pulse generator 24, zero crossover detector 26 and timing pulse generator 28, respectively. The data signals provided to the first inputs of gates 14 and 16 are alternately gated through these gates by an enable signal appearing on line 30 and timing signals provided on line 32. When gate 14 is enabled, gate 16 is disabled and vice versa, with data being ingated to a storage register 34 when data is being outgated from a storage register 36 into delta modulator decoder 38 and vice versa. The enable signal appearing on line 30 determines which segments of the input data signal are to be deleted, with the non-deleted portions of the data being pieced together in the delta modulator decoder 38 with adjacent segments of speech having the same gain factor at the point where they are joined together, as determined by the gain factor provided to the decoder 38 from a gain-save register 40, via a gating network 42. How the enabling and inhibiting of the gating networks 14 and 16 is accomplished, as well as how a determination of the gain entered into the gainsave register 40 is made, is to be described shortly.

Timing pulse generators 28 and 44 determine the basic timing for the system. Timing pulse generator 28 continuously provides four timing signals in synchronization with each timing signal provided to the input line 22 from the disk file 6. Timing pulse generator 44 provides nine timing signals which occur in response to sensing the occurrence of predetermined events during system operation. The timing pulses appearing at the output of the timing pulse generators 28 and 44 appearing on line 46 are termed "C pulses", with the C pulses being applied to first inputs of gating networks 48 and 50, with there being a single gate 48 and a single gate 50 for each timing pulse generated, that is, there are 13 gates 48 and 13 gates 50. The gates 48 and 50 are alternately enabled by a mod-2 counter 52 which first enables the gate 48, with the gate 50 being enabled when the pulse C13 is provided. The timing signals provided on the output lines 54 and 56 from the gates 48 and 50, respectively, are termed A and B pulses which are used to check for the occurrence of the predetermined events, as well as providing gating and timing signals for the system.

Consider for the moment, a representative cycle of system operation. Sections of the input audio signal are deleted in accordance with detected zero crossovers of the input audio signal as sensed by zero crossover detector 26 in accordance with signals provided from the delta modulator decoder 12. An interval counter 58 alternately counts provided A1 and B1 pulses from an OR gate 60, which has these signals alternately applied thereto from gates 48 and 50 via a line 62. A decoder 64 detects when the interval counter has reached a count greater than or equal to one-half its maximum count, as well as the maximum count. In response to provided gating signals on line 68, a gate 66 provides signal outputs indicative of when the greater than or equal to one-half maximum count and maximum counts are reached, with these signal outputs being provided, via a line 70, to the input of the timing pulse generator 44. The timing pulse generator 44 then responds to a signal input from the zero crossover detector 26, via a gate 72, to determine when the first zero crossover occurs after the greater than or equal to one-half maximum count is detected. A timing signal indicative of the detected zero crossover is provided by the generator 44 via either gate 48 or 50 to crossover detector 74 which then provides an output via line 76 to the input of generator 44 indicating whether the crossover is positive or negative. Another timing signal is then provided from generator 44 to the input of a delete network 78 which provides an inhibit signal via the line 30 for inhibiting gates 14 or 16, thereby deleting the segment of speech from the input of registers 34 or 36 which occurs between the first detected crossover of one sign until the next detected crossover of the same sign which occurs after a predetermined timing sequence. When the next crossover of the same sign is detected by the detector 74, the timing pulse generator 44 provides an output signal to delete network 78 which then changes the state of the output signal on the line 30 for once again enabling the gate 14 or 16 to pass the following portion of the speech signal to registers 34 or 36.

Counters 80 and 82 count A1 and B1 pulses from gates 48 and 50, respectively. At the end of predetermined time cycles, gates 88 and 90 are enabled by gating signals on lines 84 and 86, respectively, to pass the contents of the respective counters into buffer outgate pulse generator 24 for controlling the frequency of same. Generator 24 provides shift signals to a gating network 92, which includes gates responsive to the output signal from the mod-2 counter 52 and the timing signals from the gates 48 and 50, respectively, with shift signals from network 92 being provided via a line 94 to the input of registers 34 and 36, for controlling the shifting of information into and out of the registers 34 and 36, respectively.

In response to timing signals from gates 48 or 50, an OR gate 96 provides enable signals to gates 98 and 42, with the gate 98 providing a gain factor signal from the delta modulator decoder 12 to the input of the gainsave register 40 at the time gates 14 or 16 are inhibited, with the contents of the gainsave register 40 then being provided to the delta modulator decoder 38 via line 45 when the gate 42 is enabled at the time gates 14 or 16 are once again enabled. The enable signal applied to gate 42 is inverted by an inverter 41, with the inverted signal functioning as an inhibit signal on line 43 such that the gain factor derived in decoder 38 is not used, and the gain factor from register 40 is used. Therefore, the pieced together segments of speech have the same gain, where joined, since the gain factor stored in register 40 is the gain of the end of the first segment which is then used as the gain for the start of the segment now in decoder 38.

The inventive concept may be seen in relation to FIGS. 2A and 2B which are wave shape relationship diagrams, with FIG. 2A illustrating an input audio wave form, and with FIG. 2B illustrating the output audio wave form from the delta modulator decoder 38 with non-deleted segments of speech being pieced together without step transients being included at the places where the pieces of speech are joined together. In FIG. 2A, it is seen that at a time T0, it is assumed that the interval counter 58 has reached its first greater than or equal to one-half maximum count condition, and the zero crossover detector begins looking for a time $\epsilon_0$, for the first zero crossover which occurs at T1. The section of speech P1 is therefore provided to the input of the delta modulator decoder 38, as illustrated in FIG. 2B, with the section of speech from time T1 to time T2 being looked at. At time T2 the maximum count of the interval counter 58 occurs and the system then begins looking for a time $\epsilon_2$, for the next crossover of the same sign, namely the positive crossover which occurs at the time T3. Then, the next section of audio input P2, as illustrated in FIG. 2B, is joined to the section P1 with the same gain where joined as set forth above. The system then begins to look for the next zero crossover in response to the sensed greater than or equal to one-half maximum count condition of the interval counter 58 which occurs at time T4, with the next crossover being sensed after a time period ϵ3 at time T5. The following section of speech is deleted until the next zero crossover occurs following the sensed maximum count condition of the interval counter 58. The sensed maximum count condition occurs at time T6 with the zero crossover of the same sign occurring after a time period ϵ4 at time T7. The section of speech P3 is then joined to the section P2 of speech with the same gain where joined, as illustrated in FIG. 2B.

Before describing in detail the operation of the high speed voice replay system 2, as set in detail in FIG. 9, the operation of certain logic blocks in the system 2 of FIG. 1 will be described in detail.

In FIG. 3, a delta modulator encoder, which may be used in the practice of the invention as encoder 4, is illustrated generally at 100. The operation of this encoder is described in detail in U.S. Pat. No. 3,971,987, which is assigned to the assignee of this invention. A comparator 102 receives an audio voice input from an analog source 104, and a prediction signal, which is a representation of what it is anticipated the input signal is to look like from one sample time to the next, from a D/A converter 106. The output signal from the comparator 102 on an output line 108 is a code symbol which has a first binary value, for example a binary 1, when the signal appearing on the analog input signal line is greater than or equal to the value of the prediction signal appearing on the other input line. Conversely, if the analog input signal has a level which is less than the prediction signal, a code symbol signal indicative of a binary 0 value appears on the output line 108. In practice, the code symbol from the comparator 102 appearing on the line 108 may be represented by a pulse or no-pulse condition, a positive pulse or negative pulse condition, or by a double rail type system wherein there is a first output line and a second output line from the comparator, with a pulse being present on the first output line when there is a binary 1 condition sensed by the comparator 102, and conversely there being a pulse output on the second output line when there is a binary 0 condition sensed by the comparator 102. A gate 110 passes the appropriate binary 1 or 0 code symbol indication to an output line 112, with this signal being provided to an output terminal 114 and to the input of a shift register such as the storage register 116. The code symbol signal indication appearing at the terminal 114 is provided to an output line 118 and from there to the disk file 6 illustrated in FIG. 1.

The storage register 116 includes a predetermined number of stages and, by way of example only, the storage register is chosen to have four stages, with the stored binary bit pattern at any instant defining a state of signal activity relative to the input signal. The output from the storage register 116 is applied in parallel to a decoder apparatus 120 which decodes the message stored in the storage register 116 and provides on one of sixteen output lines shown at 122, a signal indicative of the present state of signal activity. The output of the decoder 120 is provided on the line 122 to the respective inputs of a delta table 124, a gain logic network 126 and a threshold table 128.

The delta table 124 is a table look-up device such as a read-only memory in which there are stored 16 integer values which may be positive or negative numbers in 2's complement form and which values are addressed by the output of the decoder 120. At any given sample time one of the values is selected in response to the decoded message and applied to the input of a plurality of gates which is illustrated generally at 130. As is known in the art, the delta increments selected from the table 124 are accumulated and form in part the prediction signal which is applied to the input of the comparator 102. This is to be described in more detail shortly.

The threshold table 128 is another look-up device containing 16 integer values which may be positive or negative numbers in 2's complement form and which are addressed by the decoder 120, with the selected integer value output from the table 128 being applied to the input of a plurality of gates which are illustrated generally at 132. The integer value output from the threshold table 128 is subsequently used as a threshold or reference level to which the successive accumulated delta increments are added for forming the prediction signal.

The gain logic network 126 is comprised of an 8-bit counter and two decoder networks. The gain logic network 126 responds to the decoded message from the decoder 22 and in response thereto provides a modifier or gain factor signal on an output line 134 which is used to modify the selected delta increment and the selected threshold value. This modifier signal may be, for example, a multiplier signal which multiplies the selected delta increment value and the selected threshold value by an integer amount dependent upon the state of signal activity represented by the output of the decoder 120. In the embodiment set forth, the integer values used in the multiplication process may be 1, 2, 4, 8, 16 or 32. The gain logic network 126, therefore, functions to expand the available values from the tables 26 and 30 while minimizing the number of required logic networks and space required in the encoding device.

The respective outputs from the gates 130 and 132 are applied, at selected time intervals, via line 136 to the input of a data register 138, with the data register at one time period storing the modified delta increment, and at another time period, storing the modified threshold value. The timing sequence provided by the pulse generator 105 is described shortly.

The output from the data register 138 is applied via a line 140 to the first input of an adder 142, with the output of the adder 142 being applied via a line 144 to respective first inputs of a gate 146 and a gate 148. The gate 148 provides on an output line 150 the respective summed modified delta increments which are applied to the input of an accumulator 152, with the accumulated modified delta increments being applied via an output line 154 to the input of a gate network 156, with the gate 156 passing the accumulated modified delta increments to the input of a data register 158 which applies the accumulated modified delta increments to a second input of the adder 142 via a line 160. It is seen that the adder 142, therefore, sums the previous accumulated modified delta increments with the new modified delta increment and the new modified threshold value. The gate 146 passes the successive modified delta signal level increments which have been summed with the successive modified threshold values and applies this digital signal via a line 162 to an input of a shift register 164 which applies this signal via a line 166 to the input of a D/A converter 106 for providing the analog prediction signal, which is a representation of the input signal, to the second input of the comparator 102 for comparison with the input signal.

Figure 4:
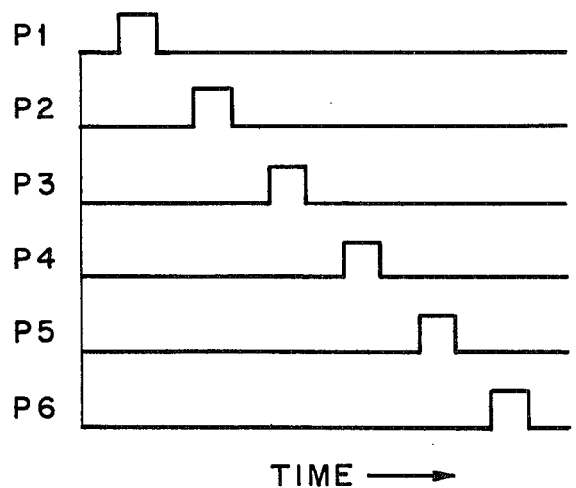
FIG. 4 is a timing diagram which is helpful in understanding the operation of the encoder set forth in FIG. 3.

Refer now to FIG. 4 which is a timing diagram which sets forth the timing sequence for the encoder 100 illustrated in FIG. 3. For system initialization conditions assume that the gain logic network 126 provides a signal output calling for maximum multiplication of the delta increment and the threshold increment, namely a value of 32. Also, assume that the accumulator 152 has stored therein the maximum negative number. The maximum gain from the network 126 and the maximum accumulated negative number from the accumulator 152 is chosen such that the encoder 100 rapidly integrates towards the value of the input signal, since the level of the prediction signal initially lags the level of the input signal. At pulse P1 time, the shift register 116 is pulsed to shift the presently stored message into the temporary storage stages. At this time the message stored is all zeros, 0 0 0 0. The gates 132 also are sampled for determining the amount the present threshold value is to be multiplied. The selected threshold value is then multiplied by the gain factor and applied to the input of the data register 138 and from there to the input of the adder 142. This signal is then added with the present accumulated sum from the accumulator 152 and the new signal appearing on the output line 144 is the old accumulation plus the modified threshold value which is passed by the gate 146 at pulse P2 time to the data register 164 and to the D/A converter 106 for forming the new analog prediction signal which is applied to the second input of the comparator 102 for providing a new code symbol, namely a binary 1 signal output on the line 10 to the input of the gate 110. It is assumed that the signal is a binary 1 level since it takes a finite amount of time for the level of the prediction signal to catch up with the level of the input signal. At time P3 the gate 110 is sampled and the binary 1 code symbol signal indication is manifested on the output line 112, is applied to the terminal 114 and in turn to the input of the storage register 116, with this signal being stored in the first stage of the shift register at P3 sample time. At pulse P4 time, the gain logic network 126 responds to the decoded message from the decoder 22 and in response thereto the 8-bit counter is decremented by 2, due to the binary condition 0 0 0 1, and the resultant new modifier signal is applied to the gates 130 and 132, respectively. At pulse P5 time, the gate 130 has the selected delta increment multiplied by the multiplication factor from the gain logic network 126 and this modified delta increment signal is applied to the data register 138 and in turn to the first input of the adder 142 for addition with the previous accumulated modified delta increments. At P6 time the output of the adder 142, which is the sum of the accumulated modified delta increments and the new modified delta increment, is passed to the input of the accumulator 152 by way of gate 148. It is to be noted at this time that the accumulated modified delta increments are passed to the accumulator 152 rather than being passed by the gate 146 to the data register 164 and the D/A converter 106. This is so since the accumulated modified delta increments are summed with the selected modified threshold value prior to being converted to the prediction signal. It is seen, therefore, that the modified delta increments are accumulated, and therefore are cumulative in nature, whereas the selected modified threshold values are not accumulated, but are used as a reference value from one sample time to the next. The operations performed by the adder and accumulator are all done by 2's complement arithmetic. The cycle just described keeps repeating for the duration of system operation.

Refer now to FIG. 5 which is a block diagram representation of a delta modulator decoder 168 which may be used as the decoders 12 and 38 (FIG. 1) in the practice of the present invention. Generated code symbols from the disk file 6 via the encoder 4 as manifested on the line 10 (FIG. 1) are provided to the respective inputs of a shift register such as the storage register 170, and a pulse generator 172, which provides timing for the decoder in synchronization with the received code symbols. The storage register 170 is, for purposes of illustration only, illustrated as a 6-stage shift register, with the sequence of stored code symbols including the most recent code symbol generated and the preceding five code symbols. The pattern of stored code symbols, at any instant, defines a state of signal activity relative to the received signal. The output of all 6 stages are provided to a first decoder 174, with the outputs of the second through fifth stages being provided to a decoder 176, and with the outputs of the third through sixth stages being provided to the inputs of a decoder 178. The decoded message from the decoder 174 is provided to the input of a filter table 180 which functions to provide a non-linear smoothing value for the received code symbols. The filter table is described in detail in U.S. Pat. No. 3,916,314, P. A. Franaszek et al, which patent application is assigned to the assignee of the present invention. The output from the decoder 178 is provided to the input of a delta table 182 which is identical in operation to the delta table 124 illustrated in FIG. 3.

The output from the decoder 176 is provided to the input of a gain logic network 184 which is similar to and functions in a like manner as the gain logic network 126 illustrated in FIG. 3.

The gain logic network 184 responds to the decoded message from the decoder 176 and in response thereto provides a gain factor signal output via a normally enabled gate 131 to the gates 186 and 188 and to an output line 185.

With reference to the decoder 38, the gain factor may also be derived from an external source. For example, when the gain factor from register 40 is to be used at times A13 and B13, as is to be explained in more detail later. At these times, the A13 or B13 pulse is inverted by the inverter 41 (FIGS. 1 and 9B), and the resultant inhibit signal is provided on line 43 to inhibit gate 131 from passing the gain factor signal from gain logic network 184. At the same time the gain factor signal from gainsave register 40 is passed via enabled gate 42 (FIGS. 1 and 9B) to line 45 with this gain factor signal being used. How the gain factor signal appearing on line 45 and the inhibit signal appearing on line 43 are derived was set forth in general relative to FIG. 1, and will be set forth in detail relative to FIG. 9. With reference to decoder 12, the output signal on line 185, the gain factor, is applied to gainsave register 40 via gate 98 (FIG. 1) at times A9 and B9, as is to be explained in more detail later.

The selected smoothing value from the filter table 180 is provided to a plurality of gates 186 which are under the control of the gain factor signal to provide a modified smoothing value which is the selected smoothing value multiplied by a predetermined integer value as determined by the gain logic network 184.

The signal output from the delta table 182, that is the selected incremental signal level, is passed to gates 188 which provide a modified incremental signal level output which is the selected incremental signal multiplied by an integer value determined by the gain logic network 184. The respective outputs from the gates 186 and 188 are provided at selected times via a line 190 to the input of a data register 192 which in turn provides an output signal to the first input of an adder network 194, which output signal is summed with successive accumulated modified signal increment levels. The output of the adder 194 is provided to the input of a gate 196, the input of a gate 198, and the input of a gate 200. The signal passed by the gate 198, and the input of a gate 200. The signal passed by the gate 196 is accumulated modified delta increment values which have been summed with successive modified smoothing values from the filter table 180. This signal is then passed to the input of a data register 202, and then to a D/A converter 204, with the analog signal appearing at the output thereof being provided to an analog receiver 206 as a usable reproduction of the analog voice input signal provided by the source 104 as shown in FIG. 3.

The output from the adder 194 is passed by the gate 200 to an accumulator 208 for accumulation of the modified delta increments, which are then passed by a gate 210 to the input of data register 212, which also has applied to the same input, via the gate 198, non-accumulated modified delta increments. The modified delta increment values appearing at the output of the shift register 212 are provided to a second input of the adder 194 and are summed with the new modified smoothing value.

Figure 6:
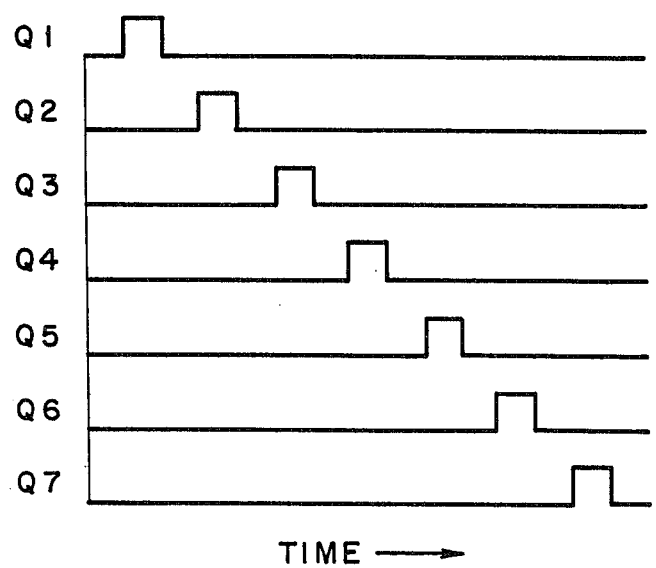
FIG. 6 is a timing diagram which is helpful in understanding the operation of the decoder set forth in FIG. 5.

Refer now to FIG. 6 which is a timing diagram which sets forth the timing sequence of the decoder 168 illustrated in FIG. 5. At Q1 pulse time the code symbols stored in the storage register 170 are shifted to the temporary storage portion thereof. At pulse Q2 time the code symbols stored in the temporary stages of the register are then shifted to the following stages and the accumulated modified delta increments are shifted from the accumulator 208 through the gate 210 and the data register 212 to the adder 194 for addition with the modified smoothing value. At pulse Q3 time the decoder 176 is sampled by the gain logic network 184 for determining which modifier signal is to be generated in response to the present state of signal activity. At pulse Q4 time the selected delta increment as manifested at the output of the delta table 182 is modified, that is, multiplied by the selected integer value from the gain logic network 184 and is passed via the line 190 to the input of the data register 192 and then to the adder 194 for addition with the old sum presently stored in register 212. At pulse Q5 time the new sum output from the adder 194 is passed by the gate 198 to the input of the data register 212, and is passed by the gate 200 to the input of the accumulator 208. At pulse Q6 the selected smoothing value from the filter value table 180 is modified, that is, multiplied in the gates 186 by the selected integer value from the gain logic network 184 and is passed via the line 190 to the input of the data register 192 and to the adder 194 for addition with the new sum. At pulse Q7 time the output from the adder 194, which is the new sum plus the modified smoothing value, is passed by the gate 196 to the shift register 202 and from there to the D/A converter 204 for conversion to analog form for reception by the analog receiver 98 for reconstructing the input signal.

Figure 7B:
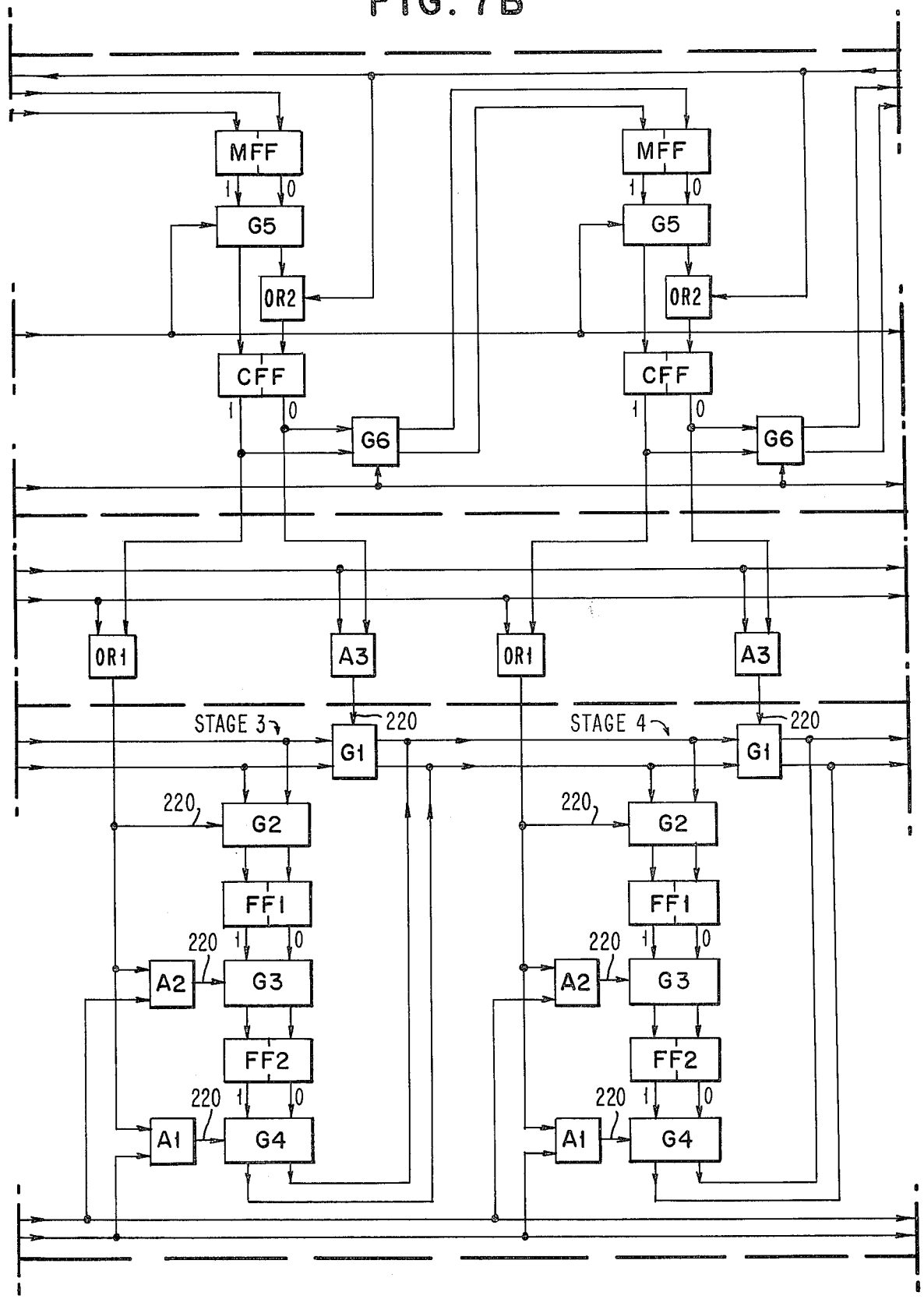

Refer now to FIG. 7 which is a schematic diagram representation of a shift register which may be used in the practice of the present invention as either the shift register 34 or 36 illustrated in FIG. 1. The shift register of FIG. 7 is a modification of the shift register set forth in U.S. Pat. No. 3,781,821 which is assigned to the assignee of the present invention. The operation of the shift register of FIG. 7 will be explained as if it were functioning as the shift register 34.

The register 34 is comprised of a buffer portion 214, a mask portion 216 and a gating portion 218. The operation of the register is as follows. A 6-stage shift register is shown, however, it is to be understood that in practice the register has N-stages, with N being an integer equal to the maximum number of digits in the delta modulated coded voice signal. Associated with each stage is a transfer control gate G1. Each stage of the register comprises an input control gate G2 having its output connected to an input flip flop FF1, which in turn is connected to a storage flip flop FF2 through a storage gate G3. Each of the storage flip flops FF2 is connected to the input of the gate G1 associated with the succeeding stage and the input of gate G2 of the succeeding stage through a transfer gate G4. The gates G(n) remain closed and are only opened as long as their control input 220 is energized. The gates G4 and G3 have their control inputs 220 energized by clock pulse sources S1A and S2A, through AND gates A1 and A2, respectively. How the clock pulses S1A and S2A are generated, is described in relation to FIG. 9. The second input to each of the gates A1 and A2, along with control input 220 of gate G2, is connected to the output of an OR gate OR1 in the gating network 218. The gates G1 have their control inputs 220 energized by the outputs of the gate A3. The gates A3 have two inputs, one of which is connected to the zero output of a flip flop CFF in the mask network 216, and the other of which is connected to an enable line 222 which receives the enable B pulse from the mod-2 counter 52 (FIG. 1). The signal output of the OR gates OR1, as set forth above, serve as an enable signal to the line 220 of gate G2, and to a first input of each of the gates A1 and A2. The gates OR1 have a first input from an enable A line 224 which receives the enable A pulse from mod-2 counter 52 (FIG. 1), and from the one input of each of the flip flops CFF of the mask 216. Data is supplied to the register in a double rail system via lines 226 and 228, with a pulse appearing on line 226 when a 0 is present, and a pulse appearing on line 228 when a 1 is present.

Assume that the enable A signal is provided on the line 224, and accordingly there is a signal output from the gate OR1 for each stage. Alternatively, the CFF flip flop in each of the stages in the mask 216 being in the 1 state results in the same condition. The provision of an S1A pulse on line 230 then enables each gate A1 which in turn permits each gate G4 of each stage to transfer data from each FF2 to the next stage, which is now opened by virtue of each OR1 gate providing an output in response to the enable A signal or the associated CFF flip flop being in the 1 state. After the termination of the pulse S1A, an S2A pulse is applied via the line 232 to each of the gates G3 of all stages through AND gate A2 which has its second input enabled via the OR1 gate. The information contained in FF1 is then transferred to FF2 via gate G3. Each stage of the register is thus connected to perform its normal function while the associated control transfer gate G1 is in a sense disconnected, since the gates A3 are turned off since the enable B signal on line 222 is not provided at this time. Operation of the gates to cause normal functioning of the stage will hereafter alternately be referred to as the "Stage Connect", and "Immediate Transfer Disconnect" state.

If in the above operation, each CFF flip flop is set in the 0 state and the enable B line is active, the associated A3 gates provide an output to each of the associated transfer control gates G1 of that stage. The remaining gates G2, G3 and G4 are closed, since the associated OR1 gates are receiving 0 inputs via the enable A line 224 and the one output from each of the CFF flip flops. Assume for the moment, that gate OR1 of stage 1 and gate A3 of stage 2 are providing signal outputs. Upon application of signal S1A to G4 of stage 1 via gate A1, the information contents of FF2 in stage 1 would be immediately transferred through gate G1 of stage 2 to gate G2 of stage 3. Operation of stage 2 when in this state will alternately be referred to hereinafter as "Stage Disconnect" while operation of the associated gate G1 during this time will be referred to as "Immediate Transfer Connect" with the combination state of the stage being "Stage Disconnect" and "Immediate Transfer Connect" state. Accordingly, the state of gate A3 of each stage controls each stage so that, when a signal output from the gate results, storage of input information and transfer of stored information is inhibited (Stage Disconnect) while immediate transfer of such information to the next stage is accomplished (Immediate Transfer Connect) while if there is no signal output from the gate A3, information transferred to that stage is stored therein (Stage Connect) while immediate transfer through this stage via G1, is inhibited (Immediate Transfer Disconnect).

The mask portion 216 is filled with 1's in unison with data being shifted into the buffer portion of the register. Thus, for every stage of the buffer that has data inputted thereto, a 1 appears in the associated stage of the mask. This assures, that the same number of bits that are ingated to the buffer are also outgated in the proper sequence. The 1 input of the flip flop MFF in the first stage has its 1 input permanently connected to a source of voltage +V, such that this flip flop is always in the 1 state. Accordingly, with the provision of an S2 shift pulse on line 232, a 1 is shifted through gate G5 to the 1 input of the associated flip flop CFF, and with the application of an S1 pulse to the line 234, each of the gates G6 are permitted to transfer the contents of the CFF flip flop to the MFF flip flop of the succeeding stage. Accordingly, as data is shifted into the buffer of the register, the provision of the pulses S1 and S2 shift 1's from one stage to the next in the mask in corresponding number to the data pulses provided to the buffer. The mask is set to 0, that is, provides a 0 output to each of the gates A3 of the gating network, by way of the provision of an A13 pulse to line 236 and to the 0 side of each CFF flip flop via the gates OR2. The register is ingated when line 224 is active in response to an enable A pulse, and the buffer is outgated when the line 222 is active in response to the provision of the enable B pulses. As was explained previously, and which will be explained in more detail shortly, the provision of the enable A and enable B pulses is controlled largely by the buffer gating mod-2 counter 52 (FIG. 1 and FIG. 9). How the enable A and enable B pulses, the S1A and S2A pulses, and S1 and S2 pulses are generated will be described in detail in relation to FIG. 9.

FIG. 8 is a detailed block diagram representation of the zero crossover detector 26 (FIG. 1). As previously explained, the function of the detector 26 is to determine when the audio signal has crossed the zero reference, and whether it is a positive or negative crossover. This is ascertained by first determining whether the audio signal is in the positive or negative sector with reference to the zero reference line. The detector 26 is comprised of flip flops 238, 240 and 242, and also includes AND gates 244 and 246. The $\overline{Q}$ side of flip flop 238 is connected to the clock terminal of flip flop 240 through a capacitor 248, and the Q side of flip flop 238 is connected to the clock input of flip flop 242 through a capacitor 250. Flip flop 240 is initially reset to an on condition, that is, Q is at a logical 1 and $\overline{Q}$ is at 0. Flip flops 238 and 242 are reset initially to an off condition, that is, Q is at a logical 0 and $\overline{Q}$ is at a logical 1 condition. The first inputs to the gates 244 and 246 are timing pulses from the disk file 6 (FIG. 1) via the line 20, and a second input to the gate 244 via the line 252, and a second input to the gate 246 via a line 254. The lines 252 and 254 are connected to the most significant bit section of the adder 194 in the decoder unit 12, and when the most significant bit equals 0, the audio signal is in the negative sector and the line 252 is active, whereas if the most significant bit equals a 1, the audio signal is in the + sector and the line 254 is active. With the flip flops 238, 240 and 242 reset to the conditions previously set forth, output line 256, which is indicative of a negative crossover, is at a logical 1, and output line 258, which is indicative of a positive crossover, is at a logical 0. For purposes of description, assume that the audio signal now goes from the negative sector to the positive sector, that is, the most significant bit goes from 0 to 1, and accordingly gate 246 provides a pulse output to the C1 input of flip flop 238. Since flip flop 238 is initially in the off condition, $\overline{Q}$ is at a logical 1 which is applied to the J input of flip flop 238, and in response to the pulse input to the C1 input the flip flop is switched such that 0 goes to a logical 1 and $\overline{Q}$ goes to a logical 0, which is indicative of the audio signal now being in the positive sector. The change of $\overline{Q}$ from flip flop 238 from a logical 1 to a logical 0 is passed through capacitor 248 as a clock pulse such that flip flop 240 is reset to the 0 state since its R input is at a logical 1 due to $\overline{Q}$ of flip flop 242 being at a logical 1. Accordingly, Q of flip flop 240 goes to a logical 0 and the negative crossover line 256 goes to a logical 0. The change of state of Q by flip flop 238 to a logical 1 is coupled through capacitor 250 to the clock terminal of flip flop 242. The set input of flip flop 242 is at a logical 1 at this time, since flip flop 240 was originally in an on condition. Accordingly, flip flop 242 changes state such that the Q output thereof goes to a logical 1 and output line 258 goes to a logical 1 indicating a positive crossover.

At this time, flip flops 238 and 242 are in the on condition and flip flop 240 is in the off condition indicating a positive crossover. Consider now the operation of the detector 26 when a negative crossover is detected. When a negative crossover occurs, the most significant bit from the decoder 12 goes from a 1 to a 0 and line 252 goes to a logical 1 and line 254 goes to a logical 0. Accordingly, gate 244 provides a pulse input to the C2 terminal of flip flop 238. The K terminal thereof is at a logical 1 since flip flop 238 has a logical 1 at the Q output thereof, and accordingly flip flop 238 switches state and $\overline{Q}$ thereof goes to a logical 1. The change of state of flip flop 238 is coupled from the $\overline{Q}$ side through capacitor 248 as a clock pulse to the terminal C of flip flop 240. The S terminal thereof is at a logical 1 since Q of flip flop 242 is at a logical 1 at this time, and accordingly flip flip 240 changes states such that the Q output thereof goes to a logical 1 indicating a negative crossover on line 256. The change of state of flip flop 238 from on to off is coupled from the Q side thereof through capacitor 250 as a clock pulse to the C terminal of flip flop 242 which has its reset terminal at a logical 1 at this time, in response to the previous off condition of flip flop 240. Accordingly, flip flop 242 is turned off and the Q output thereof goes to a logical 0, such that the output line 258 goes to a logical 0 indicating that there is no positive crossover at this time. The function of the detected negative and positive crossovers by the detector 26 relative to the rest of the system is to be explained in detail shortly with reference to FIG. 9.

Refer now to FIG. 9 which is a detailed block diagram representation of the high speed voice replay system of the present invention. As previously explained with reference to FIG. 1, the system is controlled by pulse generators 28 and 44 (FIGS. 9E and 9F). The pulse generator 44 is comprised of single shot multivibrators 260, 262, 264, 266, 268, 270, 272, 274 and 276, as well as OR gates 278 and 280. The pulse generator 28 continuously provides a sequence of 4 pulses namely, C1, C2, C3 and C4 in response to each timing signal applied to input line 22 from the disk file 6 (FIG. 1). The pulse generator 44, on the other hand, provides pulses in response to the sensed occurrence of predetermined events during system operation. The C pulses from the generator 28 are provided to gates 48 and 50, with the gates 48 providing An pulses on the output line 54 in response to the mod-2 counter 52 (FIG. 9D) being in the 0 state, and with gate 50 providing Bn pulses on output line 56 when the mod-2 counter 52 is in the 1 state. The gates 48 and 50 are also responsive to pulses C5 through C13 which are generated by the pulse generator 44.

Figure 9A:
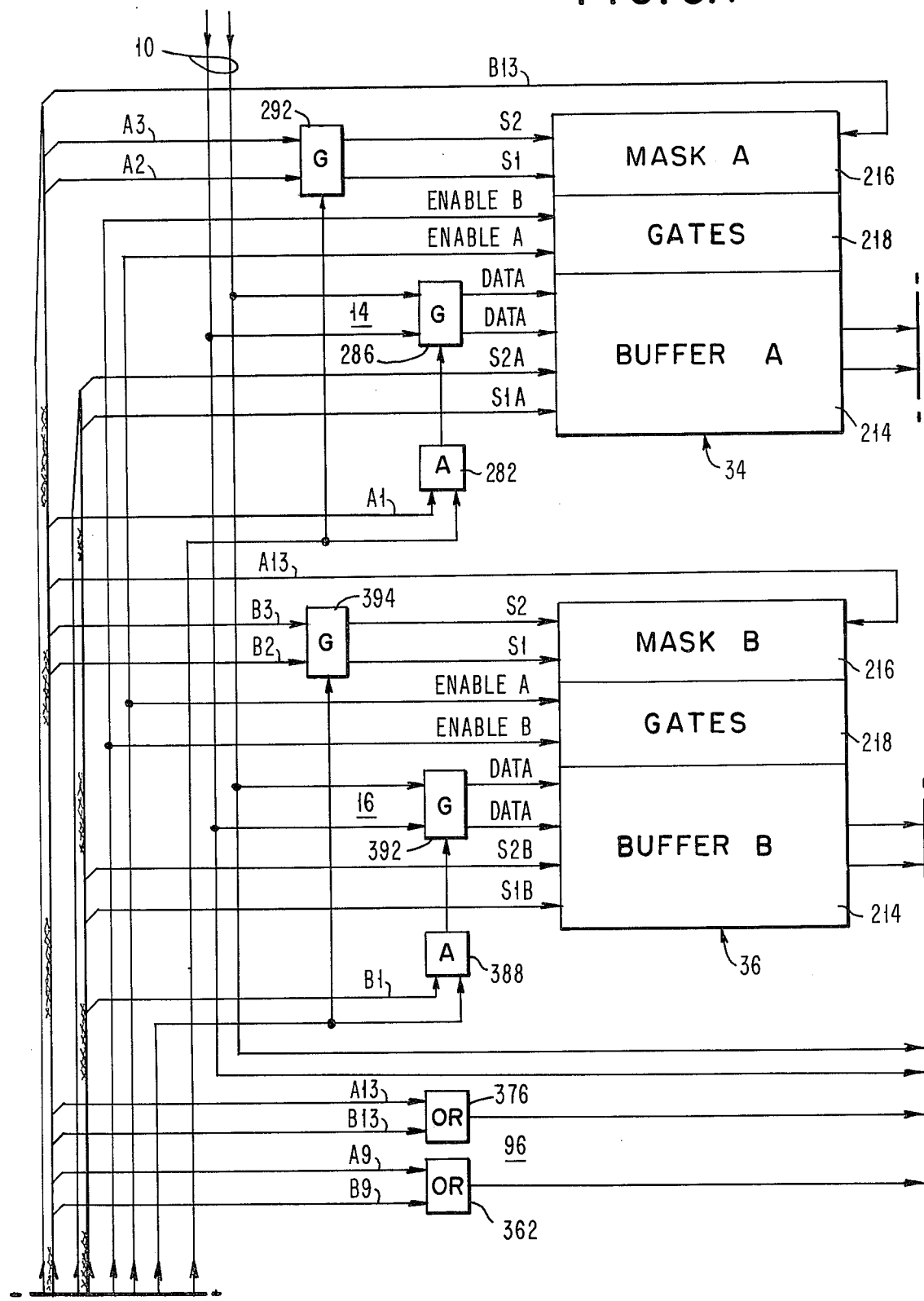
Figure 9B:
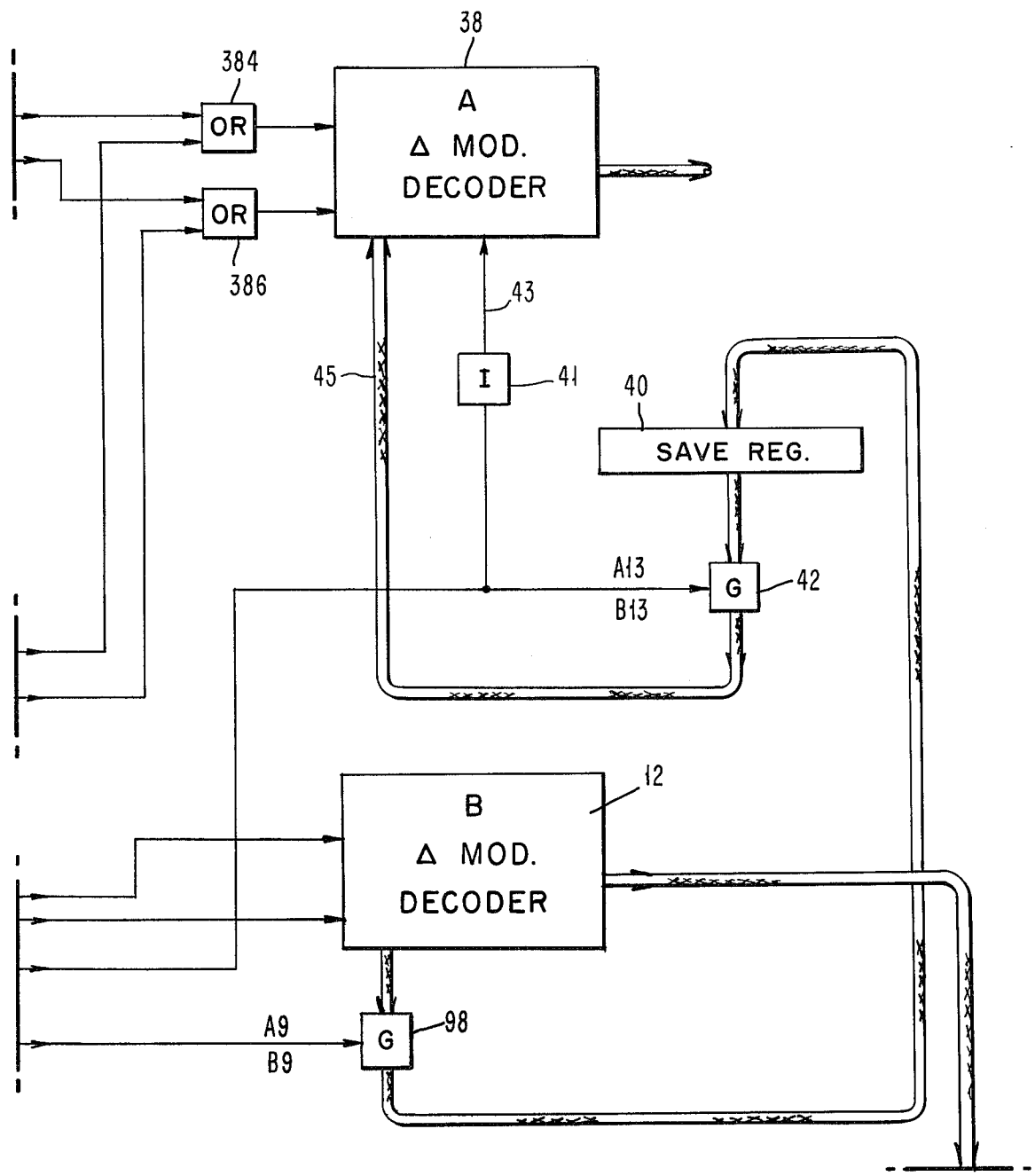

For purposes of description, assume that the mod-2 counter 52 is initially in the 0 state, and therefore gate 48 is enabled and gate 50 is disabled. In response to the provision of the C1 pulse by generator 28, an A1 pulse is passed from the gate 48 to the input of counter 80 (FIG. 9C); to the input of interval counter 58 via OR gate 60 (FIG. 9D); and to AND gate 282 at the input of register 34 (FIG. 9A). The second input to the AND gate 282 is from the 0 side of the A-delete flip flop 284 which forms a portion of the delete network 78 (FIG. 9F). When the A-delete flip flop 284 is in the 0 state and an A1 pulse is provided to the input of the gate 282 a pulse is provided to enable gate 286 to pass audio data to the buffer section 214 of register 34.

The C2 pulse provided by generator 28 is passed by the gates 48 as an A2 pulse to first inputs of AND gates 290 (FIG. 9C) and a first input of gate 292 (FIG. 9A). The second input of the gate 290 is from the 0 side of the A-delete flip flop via line 294, with this signal also being provided to the enable input of the gate 292. Gate 292 then provides an S1 shift pulse to the mask section 216 of the register 34. The pulse output from the AND gate 290 is passed by an OR gate 296 as an S1A pulse which is provided as a shift pulse to the buffer section 214 of the register 34.

Figure 9C:
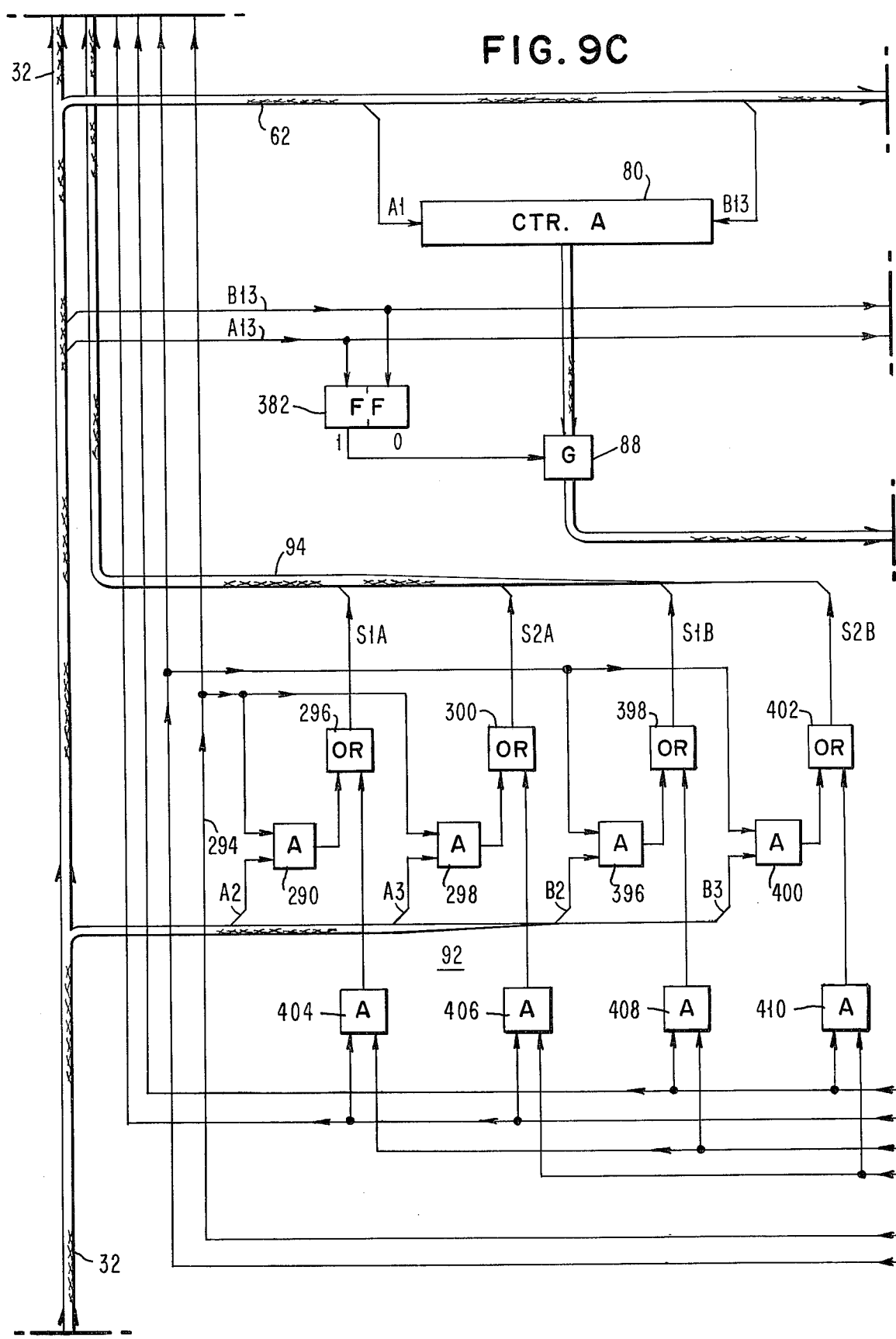

The C3 pulse from the pulse generator 28 is passed by the gates 48 as an A3 pulse which is provided to the gate 292 and an AND gate 298 (FIG. 9C). The second input to the AND gate 298 is from the 0 side of the A-delete flip flop, and accordingly a pulse output is provided from the output of the AND gate 298 to an OR gate 300 which passes this pulse as an S2A pulse to the buffer section 214 of the register 34. Gate 292 passes the A3 pulse input as shift pulse S2 to the mask section 216 of the register 34.

Figure 9D:
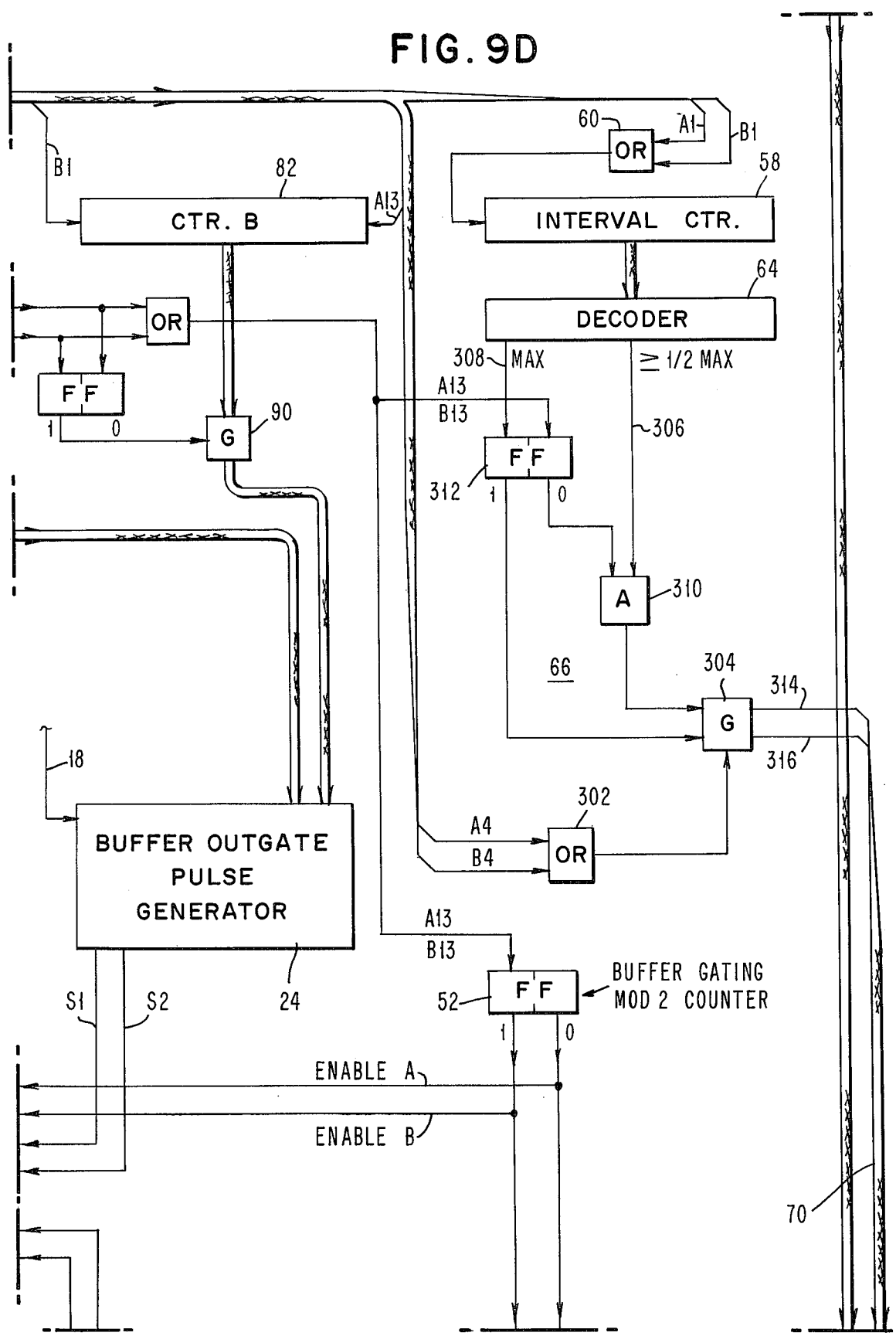
Figure 9E:
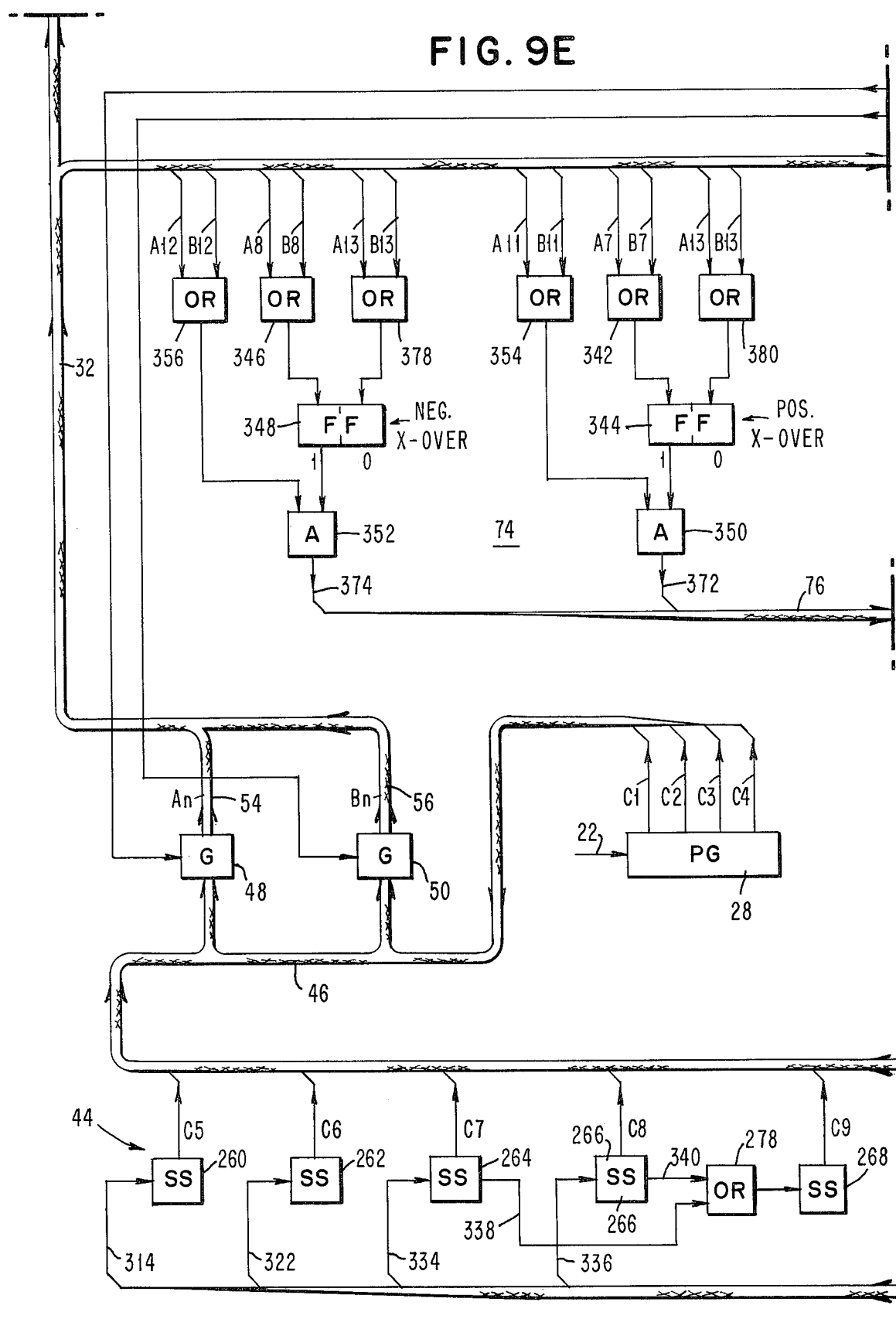

The C4 pulse from generator 28 is passed by the gates 48 as an A4 pulse which is used to test the count of the interval counter 58 (FIG. 9D). The A4 pulse is passed by an OR gate 302 to the enable input of a gate 304. The decoder 64 provides a signal output on line 306 if the interval counter is at a count greater than or equal to one-half its maximum count, or provides a signal output on line 308 if the interval counter has reached its maximum count. In the event that the interval counter 58 has yet to reach one-half its maximum count there is no signal out from the decoder 64. Assume that the latter condition exists. Therefore, AND gate 310 is receiving no signal input on line 306, and is receiving a 1 state signal from the 0 side of flip flop 312. There is, therefore, no signal output on line 314 from gate 304 which is indicative of the interval counter being at least than one-half maximum count, and there is no signal output on line 316 from gate 304, since flip flop 312 is in the 0 state, which indicates that the interval counter has yet to reach its maximum count. Line 314 is connected to the input of single shot 260 and line 316 is connected to the input of single shot 270. Therefore, single shots 260 and 270 do not provide signal outputs, which would be pulses C5 and C10, respectively. Therefore, upon the generation of the following C4 pulse in the next cycle of generator 28, an A4 pulse is again provided to the input of OR gate 302, enabling gate 304 to once again test the output from the interval counter. Assume, with the generation of this A4 pulse that the interval counter has reached a count greater than or equal to one-half its maximum count, and therefore, a signal output is provided on line 306 and gate 310 passes this through gate 304 via line 314 setting single shot 260, which in response thereto generates the C5 pulse. The C5 pulse is passed as an A5 pulse by gates 48 to a first input of AND gate 318 which is receiving a logical 1 input from the 0 side of A-delete flip flop 284. Accordingly, gate 318 provides a pulse output which is passed by OR gate 320 to line 322. The signal output on line 322 sets single shot 262 to provide a C6 pulse output therefrom which is passed by the gates 48 as an A6 pulse.

The A6 pulse is provided via line 324 to a first input of OR gate 326 (FIG. 9F) which passes this signal as an enable signal to gate 328 which tests to see if a zero crossover has been detected by Zero Crossover Detecting unit 26. The detection of a negative zero crossover is provided as a signal input via line 330 to a first input of gate 328, and the detection of a positive zero crossover is provided via a line 322 to a second input of the gate 328. If there is no detected crossover, the cycle of C1 through C6 pulses are once again generated, with the A6 pulse once again testing for a zero crossover. In the event a positive crossover is detected, a pulse output is provided on the line 334 from gate 328 setting single shot 264 which then provides a C7 output pulse therefrom. Alternatively, if a negative crossover is detected, a pulse output is provided on line 336 from gate 328 and single shot 266 is set providing a C8 pulse output therefrom. Upon the cessation of the C7 and C8 pulses a pulse output is provided on lines 338 and 340 from single shots 264 and 266, respectively which are passed by OR gate 278 to set single shot 268 to provide a C9 pulse output.

Assume that a positive zero crossover has been detected and that single shot 264 has been set providing a C7 output pulse which is passed by the gates 48 as an A7 pulse, which is in turn passed by OR gate 342 (FIG. 9E) to set positive crossover flip flop 344 to the 1 state. If a negative crossover had been detected the C8 pulse is passed by the gates 48 as an A8 pulse which in turn is passed by OR gate 346 to set negative cross-over flip flop 348 to the 1 state. The 1 outputs from the flip flops 344 and 348 are provided to first inputs of AND gates 350 and 352, respectively, which have second inputs thereof provided from the output of OR gates 354 and 356, respectively. The OR gates 354 and 356 do not provide a signal output at this time as they are energized by the A11 or B11 and A12 or B12 pulses, respectively.

Assuming that a positive zero crossover has occurred, upon completion of the C7 pulse, the single shot 264 provides a pulse output on line 338 which is passed by the OR gate 278 which sets the single shot 268 thereby providing a C9 pulse output therefrom which is passed by the gate 48 as an A9 pulse. The A9 pulse sets the A-delete flip flop 284 to the 1 state, such that a 0 state signal is provided from the 0 side therefrom to the gates 282 and 292 inhibiting same, such that data is no longer shifted into or through the shift register 34. Accordingly, from this time on the incoming audio data is deleted from being inputted to the shift register 34 until the occurrence of the A13 pulse which will once again set the flip flop 284 to the 0 state.

Figure 10:
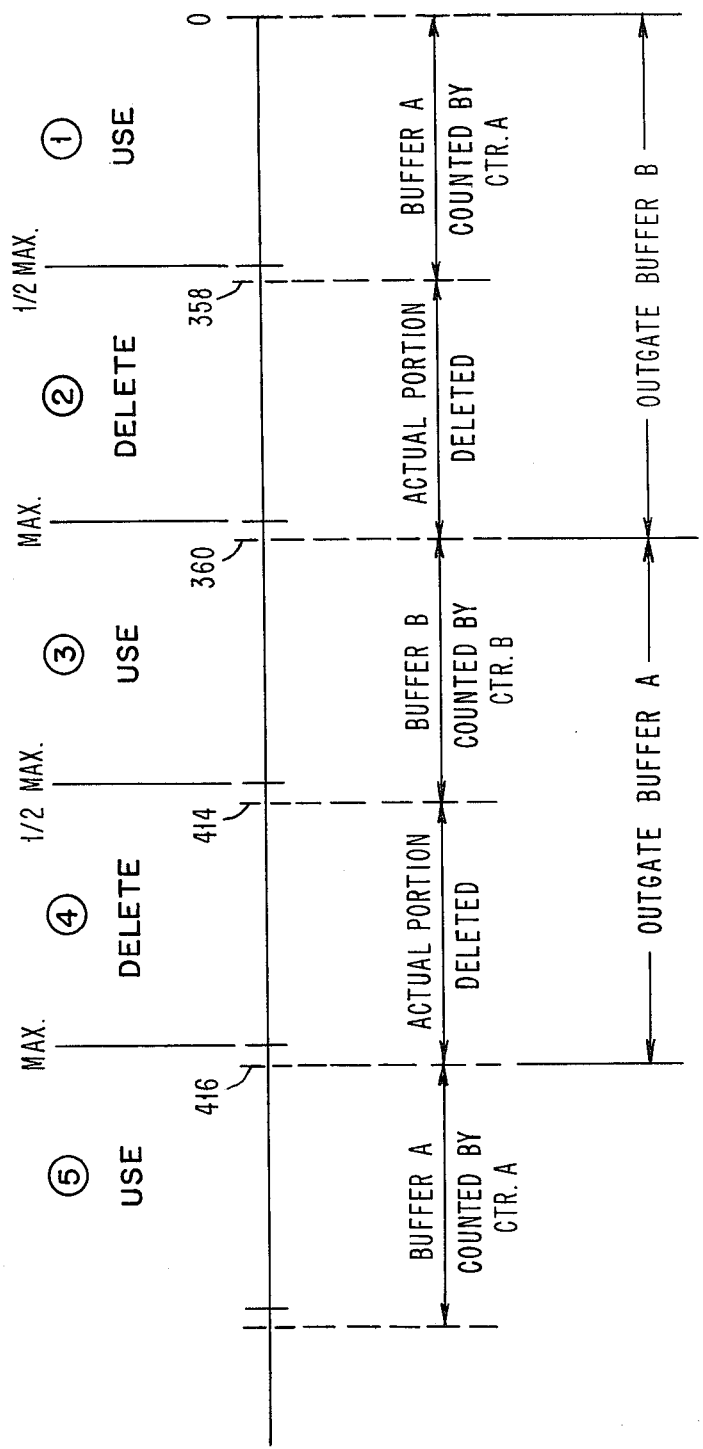
FIG. 10 is a time relationship diagram which is useful in understanding the operation of the system of FIG. 9.

Refer briefly to FIG. 10, where it is seen from the 0 time reference to shortly after the detected one-half maximum count the buffer A is provided shift pulses from the pulse generator 24 as indicated and this portion indicated by the circled 1 is provided to the shift register 34. Upon generation of the A9 pulse following the detection of the one-half maximum count as indicated at 358, the circled portion 2 is deleted until the generation of the A13 pulse which occurs at 360 following the detection of the maximum count. How the A13 pulse is generated will be explained shortly.

The A9 pulse is also passed by OR gate 362 (FIG. 9A) which forms part of the gating network 96 to the enable input of gate 98, which then passes the gain stored in the delta mod decoder 12 at this time to the gainsave register 40. This is the gain of the speech signal at the point just prior to the speech being deleted. The gain of this first portion of the speech input signal will subsequently be transferred via the gate 42 and line 45 at A13 time to the delta mod decoder 38 such that the following section of speech which is pieced with the preceding piece of speech will have the same gain where they are pieced together, thereby eliminating any step transients and the attendant clicking sounds. That is, the stored gain at A9 time, point 358 FIG. 10, is substituted for the gain of register 38 at A13 time, point 360 FIG. 10.

As previously explained, with the generation of each A4 pulse, gate 302 passes a pulse to gate 304 to test the interval counter. Assuming, that the interval counter has now reached its maximum count, the line 308 provides a signal output which sets the flip flop 312 to the 1 state, and gate 304 at A4 time provides a pulse output on the line 316 to the input of single shot 270 which provides a C10 pulse output which is passed by the gate 48 as an A10 pulse. The A10 is provided to a first input of OR gate 364 (FIG. 9F) which passes this pulse as an enable signal to gate 366 which then tests for a positive or negative crossover from the zero crossover detector 26. Assume at this time a positive crossover is detected as indicated by a signal output on line 332 which is passed on the output line 368 of the gate 366, with this signal being provided to the input of single shot 272 for producing the C11 pulse, which is passed by the gates 48 as an A11 pulse. If on the other hand, a negative crossover had been detected, as sensed by a signal on the line 330 the gate 366 provides a pulse output on the line 370, with this signal being provided to the input of single shot 274 which provides a C12 pulse at the output thereof, which is passed by the gates 48 as an A12 pulse. The A11 pulse is passed by the OR gate 354 to the second input of AND gate 370 which is receiving a 1 state signal from the positive crossover flip flop 344. Therefore, the AND gate 350 provides a pulse output which indicates a second positive crossover has been detected, and this signal is provided to a first input of an OR gate 280 which provides a pulse input to the single shot 276. In response to the pulse input, single shot 276 provides a C13 pulse to the gates 48 which passes same as an A13 pulse. Assume for the moment, that a negative crossover has been detected which generated a C12 pulse from the single shot 374, with an A12 pulse then being passed by the gates 48. The A12 pulse is then passed by the OR gate 356 to a second input of the gate 352. If the negative crossover flip flop 348 is in the 0 state which indicates that a negative crossover had not been detected prior to this, the AND gate 352 would be disabled. On the other hand, if a negative crossover had been previously detected, the flip flop 348 would be in the 1 state and the AND gate 352 would provide a pulse output via the line 374 to the second input of the OR gate 280, with this pulse being provided to the input of the single shot 276, with single shot 276 providing a C13 pulse output and in turn a A13 pulse output from the gate 48.

The A13 pulse is passed by OR gate 376 and is inverted by the inverter 41, and the resultant inhibit signal is applied via line 43 to the gate 131 (FIG. 5) of decoder 38 for inhibiting the provision of the gain factor from gain logic network 184 to gates 186 and 188 at A13 pulse time. The A13 pulse passed by OR gate 376 also enables gate 42 to pass the gain factor stored at A9 pulse time in gainsave register 40 to gates 186 and 188 via line 45. Accordingly, the gain factor for each undeleted segment of speech where joined together is the gain factor generated at A9 pulse time. That is, the end of the segment of speech at point 358 of FIG. 10 has the gain factor generated at A9 pulse time, and the beginning of the segment of speech at point 360 of FIG. 10, which occurs at A13 pulse time, has the gain factor stored at A9 pulse time. Therefore, the undeleted segments of speech where joined or pieced together have the same gain factor, namely the gain factor generated at A9 pulse time. Since the gain factor is the same, where the undeleted segments are joined, step transients and the attendant clicking sounds are eliminated.

The A13 pulse is also used to reset the A-delete flip flop 284 and the B-delete flip flop 390 to the 0 state; is passed by the OR gate 301 to reset the maximum interval flip flop 312 to the 0 state and to set the buffer gating mod-2 counter 52 to the 1 state to provide the enabled B pulse; is passed by the OR gate 378 for resetting the negative crossover flip flop 348 to the 0 state; passed by the OR gate 380 to set the positive crossover flip flop 344 to the 0 state; is used to reset the B counter 82 to the 0 state; is used to set flip flop 382 to the 1 state thereby enabling gate 88 to pass the contents of A counter 80 to the buffer outgate pulse generator 24. The pulse generator 24 then adjusts its frequency output in accordance with the count from counter 80. The A13 pulse is also used to reset the mask 216 in buffer B of register 36 to all zeros, and to reset flip flop 303 to the 0 state. As previously set forth, this shows a cycle of operation up to the point 360 on FIG. 10.

Since the buffer gating mod-2 counter 52 is now in the 1 state providing the enable B pulse to the enable input of the gate 50, the B pulses are now generated since gate 48 is disabled. Accordingly, the B buffer 214 of register 36 will be ingated and the buffer A of register 34 will be outgated via OR gates 384 and 386 to the delta mod decoder 38.

The generation of the C pulses takes place as previously explained, and the generation of the B pulses will be briefly described, as the generation should be evident in view of the description relative to the generation of the A pulses. The first C1 pulse is passed as a B1 pulse by the gates 50 to the input of AND gate 388, which is receiving an input from the 0 side of the B-delete flip flop 390 which is in the 0 state at this time, such that the gate 388 enables the gate 392 to pass data pulses to the buffer section 214 of the register 36. The 0 state signal from the B-delete flip flop is also provided to the enable input of gate 394 such that the B2 and B3 pulses may be passed as S1 and S2 signals to the mask section 216 of the register 36. The B1 pulses are also provided to the input of the B counter 82 for incrementing same and are passed to the input of interval counter 58 via the OR gate 60 to begin the interval count for the enable B cycle.

The C2 pulse is then passed by the gates 50 as a B2 pulse which is passed by the gates 394 as an S1 pulse for shifting in the mask 216 section of the counter 36, and is provided to a second input of an AND gate 396 which provides a S1B shift pulse to the buffer section 214 of the register 36.

The C3 pulse is then passed as an A3 pulse by the gates 50 to the second input of the gate 292 and is provided as an S2 pulse to the mask section 216 of the register 34 and is provided to a first input of an AND gate 400 which receives a signal input from the 0 side of the B-delete flip flop such that a pulse output is provided to the input of an OR gate 402 which provides an S2B pulse to the buffer 214 section of the register 36.

OR gates 296, 300, 398 and 402 (FIG. 9C) receive inputs to their second input terminals from AND gates 404, 406, 408 and 410, respectively, for generating the S1A, S2A, S1B, and S2B pulses. When the buffer gating mod-2 counter 52 is in the 0 state, gates 408 and 410 are enabled such that when S1 and S2 pulses are provided by the buffer outgate pulse generator 24, the S1B and S2B pulses are successively generated by the gates 398 and 402. When the mod-2 counter 52 is in the 1 state, the AND gates 404 and 406 are enabled for successively passing the S1 and S2 pulses from the pulse generator 24 for providing S1A and S2A pulses from the OR gates 296 and 300, respectively.

The C4 pulse is passed by the gates 50 as a B4 pulse which is passed by the OR gate 302 as an enable signal to the gate 304 for testing the interval counter. Assume that the interval counter has reached a count of greater than or equal to one-half maximum and a signal output therefor is provided on the line 306 to the first input of the gate 310. The second input is receiving an enabling signal from the zero side of flip flop 312 due to the generation of the A13 pulse. Accordingly, the gate 304 provides a pulse output on the line 314 to the input of single shot multivibrator 260 which then generates a C5 pulse which is passed by the gate 50, has a B5 pulse. The B5 pulse is then provided as a first input to AND gate 396 (FIG. 9F) which is receiving an enabling signal at a second input from the 0 side of the B-delete flip flop 390. The pulse output from the gate 396 is then passed by the OR gate 320 via a line 322 to the input of single shot 262 for providing a C6 pulse output which is passed by the gate 50 as a B6 pulse.

The B6 pulse is then passed by the OR gate 326 to the enable input of gate 328 which tests for negative and positive crossovers from the zero crossover detecting unit 26. Assume that a positive crossover is detected as indicated by a signal on line 332, with the gate 328 providing a pulse output on the line 334 to the input of single shot 264 which provides a C7 pulse output which is passed by the gate 50 as a B7 pulse. On the other hand if a negative crossover has been detected as indicated by a signal on line 332, with the gate 328 providing a pulse output on the line 334 to the input of single shot 264 which provides a C7 pulse output which is passed by the gate 50 as a B7 pulse. On the other hand, if a negative crossover had been detected as indicated by a signal on the line 330, the gate 328 would provide a pulse output on the line 336 which would set the single shot 266 which would provide a C8 pulse output which would be passed by the gates 50 as a B8 pulse. Upon cessation of the C7 or C8 pulse, the OR gate 278 passes a pulse output which sets the single shots 268 which provides a C9 pulse which is passed as a B9 pulse by the gate 50.

The B7 pulse is passed by the OR gate 342 which sets the positive crossover flip flop 344 to the 1 state, and the generation of a B8 pulse is passed by the OR gate 346 which sets the negative crossover flip flop 348 to the 1 state. The B9 pulse sets the B-delete flip flop to the 1 state, thereby disabling the gates 388 and 394 such that data and shift pulses are not provided to the register 36. Accordingly, the voice signal represented by the incoming data at this time is deleted until a B13 pulse is generated. The B9 pulse is passed by the OR gate 362 for enabling the gate 98 to pass the gain from the delta mod decoder 12 to the gainsave register 40. The system is now situated at point 414 as indicated in FIG. 10, and the circled portion 4 is now being deleted until the generation of the B13 pulse.

With the generation of the next B4 pulse, the OR gate 302 provides an enable signal to the gate 304 which tests the interval counter. Assume that a maximum count condition has been sensed, and accordingly the flip flop 312 is in the 1 state, which enables the gate 304 to provide a pulse output on the line 316 which sets the single shot 270 for providing a C10 pulse output which is passed by the gate 50 as a B10 pulse. The B10 pulse is provided to the OR gate 364 which provides a pulse output which enables gate 366 to test the zero crossover detecting unit 26. If a positive crossover is detected, a pulse output is provided on the line 368 from the gate 366, and on the other hand if a negative crossover is present, a pulse output is provided on the line 370 from the gate 366. A positive crossover results in single shot 272 being set, and providing a C11 pulse output which is passed by the gates 50 as a B11 pulse. The detection of a negative crossover sets the single shot 274 and providing a C12 pulse output which is passed by the gates 50 as a B12 pulse. The B11 pulse is passed by the OR gate 354 to a first input of the AND gate 350. If a positive crossover has not been previously detected the gate 350 is disabled, on the other hand if a previous positive crossover has been detected, the flip flop 344 is in the 1 state and a pulse output is provided from the gate 350 via the line 372 to a first input of the OR gate 280, which sets the single shot 276 for providing a C13 output pulse which is passed by the gate 50 as a B13 pulse. The B12 pulse is passed by the OR gate 356 as a pulse to a first input of the AND gate 352, which is connected to the 1 output of the flip flop 348. If a negative crossover has not been previously detected the AND gate 352 is disabled, however, if a negative crossover has been previously detected, the flip flop 348 would provide a 1 state signal to the gate 352, and gate 352 would provide a signal output on line 374 which is passed by the OR gate 280 to set the signal shot 276 for providing a C13 pulse which is passed by the gate 50 as a B13 pulse.

The B13 pulse is passed by OR gate 376 and is inverted by the inverter 41, and the resultant inhibit signal is applied via line 43 to the gate 131 (FIG. 5) of decoder 38 for inhibiting the provision of the gain factor from gain logic network 184 to gates 186 and 188 at B13 pulse time. The B13 pulse passed by OR gate 376 also enables gate 42 to pass the gain factor stored at B9 pulse time in gainsave register 40 to gates 186 and 188 via line 45. Accordingly, the gain factor for each undeleted segment of speech where joined together is the gain factor generated at B9 pulse time. That is, the end of the segment of speech at point 414 of FIG. 10 has the gain factor generated at B9 pulse time, and the beginning of the segment of speech at point 416 of FIG. 10, which occurs at B13 pulse time, has the gain factor stored at B9 pulse time. Therefore, the undeleted segments of speech where joined or pieced together have the same gain factor, namely the gain factor generated at B9 pulse time. Since the gain factor is the same where the undeleted segments are joined, step transients and the attendant clicking sounds as eliminated.

At this time, the buffer A has been completely outgated via the gates 384 and 386 to the delta mod decoder 38, and the segments of speech as indicated by the circled numerals 1 and 3 have been pieced together with the same gain at the points where these segments of speech were joined together. The system operation then repeats with the registers 34 and 36 alternatingly being ingated and outgated to the delta mod decoder 38 to provide a speed-up speech signal.

What is claimed is:

1. In a delta modulator audio replay system, the combination comprising:
   means for delta modulation encoding of a provided audio signal;
   means for determining the positive and negative zero crossovers of the delta modulation encoded audio signal;
   means for selectively deleting portions of the delta modulation encoded audio signal which occur between zero crossovers having the same sign, and which occur in a predetermined timing sequence;
   means for storing the delta modulation encoded audio signal which has had portions selectively deleted therefrom; and
   means for delta modulation decoding of the stored delta modulation encoded signal which has had portions selectively deleted therefrom, including means for joining the undeleted decoded portions, with said undeleted decoded portions having the same gain factor where joined.

2. In a delta modulator audio replay system, the combination comprising:
   means for providing an audio signal;
   means for delta modulation encoding said audio signal;
   a first delta modulator decoder for decoding the delta modulation encoded audio signal, and for determining the gain factor for each decoded segment of said audio signal;
   a zero crossover detector for detecting the positive and negative crossovers of the decoded audio signal from said first delta modulator decoder;
   timing means for providing timing signals, with the generation of said timing signals being controlled at least in part by the detected zero crossovers;
   a second delta modulator decoder;
   first and second storage means, with said delta modulation encoded audio signal being read into and out of said first and second storage means under control of said timing signals, with said delta modulation encoded signal being read into said first register when the contents of said second register is being read into said second delta modulator decoder and vice versa, with certain portions of said delta modulation encoded audio signal being deleted in accordance with the generation of said timing signals and as a function of the detected zero crossovers, prior to being stored in said first and second storage means; and
   wherein the gain factor for one segment of the delta modulation encoded audio signal decoded in said second delta modulation decoder is controlled by said second delta modulation decoder, and the gain factor for the following segment of speech where joined to said one segment of speech is controlled by the determined gain factor from said first delta modulator decoder.

3. In a delta modulator audio replay system, the combination comprising:
   means for providing an audio signal;
   means for delta modulation encoding said audio signal;
   means for storing said delta modulation encoded audio signal;
   a first delta modulator decoder for decoding the stored delta modulation encoded audio signal, and for determining the gain factor for each decoded segment of said audio signal;
   a first storage register for storing the determined gain factor from said first delta modulator decoder;
   a zero crossover detector for detecting the positive and negative crossovers of the decoded audio signal from said first delta modulator decoder;
   a mod-2 counter which is set to a first state when a first group of timing signals is to be generated, and which is set to a second state when a second group of timing signals is to be generated;
   a positive crossover flip flop which changes state in response to the detection of a positive crossover by said zero crossover detector;
   a negative crossover flip flop which changes state in response to the detection of a negative crossover by said zero crossover detector;
   a first delete flip flop which changes state in response to a change of state of one of said positive and negative crossover flip flops, and said mod-2 counter being in said second state;

a second delete flip flop which changes state in response to a change of state of one of said positive and negative crossover flip flops, and said mod-2 counter being in said first state;

timing means for providing said first and second group of timing signals in response to said mod-2 counter being in said first and second states respectively, with said timing means being controlled at least in part by said zero crossover detector, said positive and negative crossover flip flops, and said first and second delete flip flops;

a second delta modulator decoder for decoding undeleted portions of speech and for determining the gain factor for each undeleted portion;

second and third storage registers, with the stored delta modulation encoded audio signal being read into and out of said second and third storage registers under control of said first and second groups of timing signals respectively, with said stored delta modulator encoded signal being read into said second storage register when the contents of said third storage register is being read into said second delta modulator decoder and vice versa, with certain portions of said stored delta modulation encoded audio signal being deleted prior to being stored in said second and third storage registers, with the deletion of said certain portions being controlled in accordance with the states of said first and second delete flip flops, respectively; and wherein the gain factor for one segment of the delta modulation encoded audio signal decoded in said second delta modulation decoder is controlled by said second delta modulation decoder, and the gain factor for the following segment of undeleted speech where joined to said one segment of speech is controlled by the determined gain factor stored in said first storage register.

4. A method of changing the readout speed of a delta modulated audio signal, said method comprising the steps of:

encoding a provided audio signal in a delta modulation code;

storing the delta modulation coded audio signal;

determining the positive and negative zero crossovers of the delta modulation coded signal;

deleting portions of the stored delta modulation coded audio signal which occur between zero crossovers having the same sign at predetermined intervals; and decoding the stored delta modulation coded signal which has had portions deleted therefrom, including joining the undeleted decoded portions, with said undeleted decoded portions having the same gain factor where joined.

5. A method of controlling the readout speed of a delta modulated audio signal, said method comprising the steps of:

encoding a provided audio signal in a delta modulation code;

decoding the delta modulation encoded audio signal in a first delta modulator decoder, including determining the gain factor for each segment of the encoded audio signal;

detecting the positive and negative zero crossovers of the decoded audio signal from said first delta modulator decoder;

providing timing signals, with the generation of said timing signals being controlled at least in part by the detected zero crossovers;

deleting certain portions of the encoded audio signal in accordance with the provision of said timing signals and said detected zero crossovers;

reading said encoded audio signal, with said certain portions deleted, into and out of first and second storage means into a second delta modulator decoder under control of said timing signals, with said second delta modulator decoder determining the gain factor for each undeleted segment of speech, with said encoded audio signal with said portions deleted being read into said first storage means when the contents of said second storage means is being read into said second delta modulator decoder and vice versa; and decoding the undeleted portions of said audio signal in said second delta modulator decoder, including joining the undeleted portions with the same gain where joined, with the gain factor for one segment being determined by said second delta modulator decoder, and the gain factor for the following segment where joined, is determined by said first delta modulator decoder.

* * * * *